(12) United States Patent
Furuya et al.

(10) Patent No.: US 7,989,138 B2
(45) Date of Patent: Aug. 2, 2011

(54) FLUORINE-CONTAINING COMPOUND, RESIST COMPOSITION FOR IMMERSION EXPOSURE, AND METHOD OF FORMING RESIST PATTERN

(75) Inventors: Sanae Furuya, Kawasaki (JP);
Takahiro Dazai, Kawasaki (JP);
Takayoshi Mori, Kawasaki (JP);
Ryoichi Takasu, Kawasaki (JP);
Tomoyuki Hirano, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 140 days.

(21) Appl. No.: 12/323,212

(22) Filed: Nov. 25, 2008

(65) Prior Publication Data

US 2009/0142699 A1 Jun. 4, 2009

(30) Foreign Application Priority Data

Nov. 30, 2007 (JP) ................. P2007-311701

(51) Int. Cl.
*G03F 7/00* (2006.01)
*G03F 7/004* (2006.01)
*G03F 7/20* (2006.01)
(52) U.S. Cl. ............... 430/270.1; 430/905; 430/945; 430/311; 430/396
(58) Field of Classification Search .............. 430/270.1, 430/311, 905, 945
See application file for complete search history.

(56) References Cited

U.S. PATENT DOCUMENTS

| | | | | |
|---|---|---|---|---|
| 5,773,191 A * | 6/1998 | Padmanaban et al. | ..... | 430/270.1 |
| 5,945,517 A | 8/1999 | Nitta et al. | | |
| 6,005,137 A * | 12/1999 | Moore et al. | ................... | 560/139 |
| 6,153,733 A | 11/2000 | Yukawa et al. | | |
| 6,610,456 B2 * | 8/2003 | Allen et al. | ................ | 430/270.1 |
| 6,773,862 B2 * | 8/2004 | Shirakawa et al. | ........ | 430/270.1 |
| 7,105,270 B2 * | 9/2006 | Fujita et al. | ................ | 430/270.1 |
| 7,521,168 B2 * | 4/2009 | Mizutani et al. | ........... | 430/270.1 |
| 7,569,326 B2 * | 8/2009 | Ohsawa et al. | ............ | 430/270.1 |
| 7,592,125 B2 * | 9/2009 | Suzuki et al. | ............... | 430/270.1 |
| 2003/0236369 A1 * | 12/2003 | Komoriya et al. | ............. | 526/246 |
| 2005/0019690 A1 * | 1/2005 | Kodama | ..................... | 430/270.1 |
| 2008/0096134 A1 * | 4/2008 | Sugimoto et al. | .......... | 430/287.1 |

FOREIGN PATENT DOCUMENTS

EP 1835342 A2 * 9/2007

(Continued)

OTHER PUBLICATIONS

D. Gil et al., "First Microprocessors with Immersion Lithograhy," Optical Microlithography XVIII, Proceedings of SPIE vol. 5754, pp. 119-128 (2005).

(Continued)

*Primary Examiner* — Amanda C. Walke
(74) *Attorney, Agent, or Firm* — Knobbe, Martens, Olson & Bear, LLP

(57) ABSTRACT

A fluorine-containing compound represented by a general formula (c-1) shown below:

[Chemical Formula 1]

$$R^X\text{-}A_N\text{-}(OR^2)_a \qquad (c\text{-}1)$$

[wherein, $R^X$ represents an organic group, $A_N$ represents a naphthalene ring that may have a substituent, $R^2$ represents a base dissociable group, and a represents 1 or 2, provided that at least one among $A_N$ and said a $R^2$ groups contains a fluorine atom].

19 Claims, 1 Drawing Sheet

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| WO | WO 2004/074242 A2 | 9/2004 |

OTHER PUBLICATIONS

Shun-Ichi Kodama et al., "Synthesis of Novel Fluoropolymer for 157nm Photoresists by Cyclo-polymerization." Advances in Resist Technology and Processing XIX, Proceedings of SPIE vol. 4690 (2002).

* cited by examiner

FLUORINE-CONTAINING COMPOUND, RESIST COMPOSITION FOR IMMERSION EXPOSURE, AND METHOD OF FORMING RESIST PATTERN

BACKGROUND OF THE INVENTION

1. Field of the Invention

The present invention relates to a fluorine-containing compound, a resist composition for immersion exposure (liquid immersion lithography) containing the fluorine-containing compound, and a method of forming a resist pattern that uses the resist composition for immersion exposure.

Priority is claimed on Japanese Patent Application No. 2007-311701, filed Nov. 30, 2007, the content of which is incorporated herein by reference.

2. Description of Related Art

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

For miniaturization of semiconductor devices, shortening of the wavelength of the exposure light source, and increasing of the numerical aperture (NA) of the projector lens have progressed. Currently, exposure apparatuses in which an ArF excimer laser having a wavelength of 193 nm is used as an exposure light source and NA=0.84 have been developed. As shortening of the wavelength of the exposure light source progresses, it is required to improve various lithography properties of the resist material, such as the sensitivity to the exposure light source and the resolution capable of reproducing patterns of minute dimensions. As a resist material which satisfies these conditions, a chemically amplified resist is used, which includes a base resin that exhibits changed solubility in an alkali developing solution under the action of acid and an acid generator that generates acid upon exposure.

Currently, resins that contain structural units derived from (meth)acrylate esters within the main chain (acrylic resins) are typically used as base resins for resists that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

As a technique for further improving the resolution, a lithography method called liquid immersion lithography (hereafter, frequently referred to as "immersion exposure") is known in which exposure (immersion exposure) is conducted in a state where the region between the objective lens of the exposure apparatus and the sample is filled with a solvent (an immersion medium) that has a larger refractive index than the refractive index of air (see, for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift methods and modified illumination methods. Currently, as the immersion exposure technique, techniques using an ArF excimer laser as an exposure source are being actively studied, and water is mainly used as the immersion medium.

In recent years, fluorine-containing compounds have been attracting attention for their properties such as water repellency and transparency, and active research and development of fluorine-containing compounds have been conducted in various fields. For example, in the fields of resist materials, currently, an acid-labile group such as a methoxymethyl group, tert-butyl group or tert-butyloxycarbonyl group is being introduced into a fluorine-containing polymeric compound, and the fluorine-containing polymeric compound is then used as a base resin for a chemically amplified positive resist. However, when such a fluorine-containing polymeric compound is used as a base resin for a chemically amplified positive resist, disadvantages arise in that a large quantity of out-gas is generated following exposure, and the resistance to dry etching gases (namely, the etching resistance) is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2).

[Non-Patent Document 1]
Proceedings of SPIE (U.S.), vol. 5754, pp. 119-128 (2005)
[Non-Patent Document 2]
Proceedings of SPIE (U.S.), vol. 4690, pp. 76-83 (2002)

SUMMARY OF THE INVENTION

In immersion exposure, it is required to use a resist material that exhibits not only general lithography properties (such as sensitivity, resolution, and etching resistance), but also properties suited to immersion lithography. For example, in immersion exposure, when the resist film comes into contact with the immersion medium, elution of substances contained in the resist into the immersion medium (substance elution) occurs. This substance elution causes phenomena such as degeneration of the resist film and change in the refractive index of the immersion medium, thereby adversely affecting the lithography properties. The amount of this substance elution is affected by the properties of the resist film surface (such as the hydrophilicity or hydrophobicity). For example, by enhancing the hydrophobicity of the resist film surface, this substance elution can be reduced. Further, when the immersion medium is water, and immersion exposure is performed using a scanning-type immersion exposure apparatus as disclosed in Non-Patent Document 1, a water tracking ability wherein the immersion medium is capable of tracking the movement of the lens is required. When the water tracking ability is poor, the exposure speed decreases, and as a result, there is a possibility that the productivity may be adversely affected. It is presumed that the water tracking ability can be improved by enhancing the hydrophobicity of the resist film (rendering the resist film hydrophobic).

Accordingly, it is presumed that the above-described characteristic problems of immersion lithography, which require a reduction in substance elution and an improvement in the water tracking ability, can be addressed by enhancing the hydrophobicity of the resist film surface. However, if the resist film is simply rendered hydrophobic, then adverse effects are seen on the lithography properties. For example, as the hydrophobicity of the resist film is increased, defects tend to occur more readily on the resist film following alkali developing. Particularly in the case of a positive resist composition, defects tend to occur more readily in the unexposed portions of the resist. The term "defects" describes general abnormalities within a resist film that are detected when observed from directly above the alkali developed resist film using a surface defect detection apparatus (product name: "KLA") manufactured by KLA-TENCOR Corporation. Examples of these "abnormalities" include post-developing scum, foam, dust, bridges (structures that bridge different portions of the resist pattern), color irregularities, foreign deposits, and residues.

It is considered that a material which is hydrophobic during immersion exposure but then becomes hydrophilic during developing can address the problems described above. However, materials exhibiting such properties are essentially unknown.

The present invention takes the above circumstances into consideration, with an object of providing a novel fluorine-containing compound that is useful as an additive for a resist composition for immersion exposure, a resist composition for immersion composure that includes the fluorine-containing compound, and a method of forming a resist pattern that uses the resist composition for immersion composure.

In order to achieve the above object, the present invention adopts the aspects described below.

Namely, a first aspect of the present invention is a fluorine-containing compound represented by general formula (c-1) shown below:

[Chemical Formula 1]

$$R^X\text{-}A_N\text{-}(OR^2)_a \quad (c\text{-}1)$$

[wherein, $R^X$ represents an organic group, $A_N$ represents a naphthalene ring that may have a substituent, $R^2$ represents a base dissociable group, and a represents 1 or 2, provided that at least one among $A_N$ and the a $R^2$ groups includes a fluorine atom].

A second aspect of the present invention is a resist composition for immersion exposure including a base component (A) that exhibits changed solubility in an alkali developing solution under the action of acid, an acid generator component that generates acid upon exposure, and a fluorine-containing compound (C) represented by general formula (c-1) shown below:

[Chemical Formula 2]

$$R^X\text{-}A_N\text{-}(OR^2)_a \quad (c\text{-}1)$$

[wherein, $R^X$ represents an organic group, $A_N$ represents a naphthalene ring that may have a substituent, $R^2$ represents a base dissociable group, and a represents 1 or 2, provided that at least one among $A_N$ and the a $R^2$ groups includes a fluorine atom].

A third aspect of the present invention is a method of forming a resist pattern, including; forming a resist film on a substrate using a resist composition for immersion exposure according to the second aspect described above, subjecting the resist film to immersion exposure, and subjecting the resist film to alkali developing to form a resist pattern.

In the present description and claims, "exposure" is not limited to irradiation with light, and is used as a general concept that includes irradiation with any form of radiation, including an ArF excimer laser, KrF excimer laser, $F_2$ excimer laser, as well as EUV (Extreme Ultra Violet), VUV (Vacuum Ultra Violet), EB (Electron Beam), X-ray and soft X-ray radiation.

An "alkyl group", unless otherwise specified, includes linear, branched and cyclic, monovalent saturated hydrocarbon groups. A "lower alkyl group" is an alkyl group of 1 to 5 carbon atoms.

A "structural unit" refers to a monomer unit that contributes to the formation of a polymeric compound (namely, a polymer or copolymer).

According to the present invention, there are provided a novel fluorine-containing compound that is useful as an additive for a resist composition for immersion exposure, a resist composition for immersion composure that includes the fluorine-containing compound, and a method of forming a resist pattern that uses the resist composition for immersion composure.

DESCRIPTION OF THE REFERENCE SYMBOLS

Figure 1:
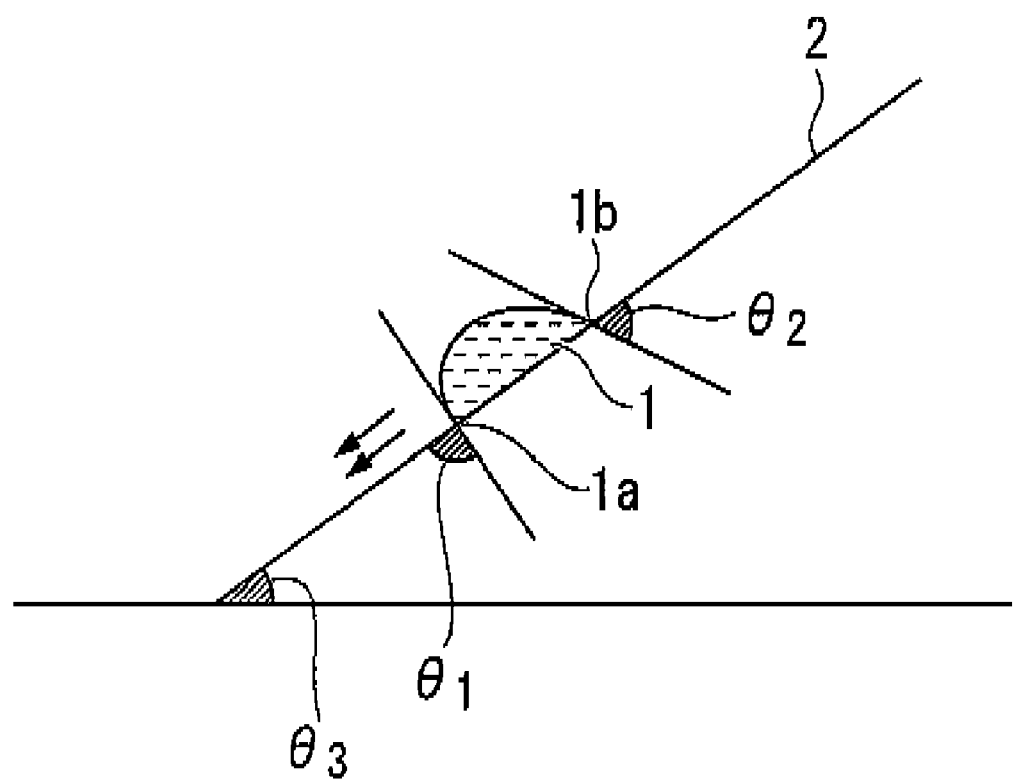
FIG. 1 is a diagram describing an advancing angle ($\theta_1$), a receding angle ($\theta_2$) and a sliding angle ($\theta_3$).

1 . . . liquid droplet, 1a . . . bottom edge, 1b . . . top edge, 2 . . . flatsurface, $\theta_1$ . . . advancing angle, $\theta_2$ . . . receding angle, $\theta_3$ . . . sliding angle

DETAILED DESCRIPTION OF THE INVENTION

<<Fluorine-Containing Compound>>

A fluorine-containing compound of the present invention (hereafter frequently referred to as "fluorine-containing compound (C)") is represented by general formula (c-1) shown above.

In formula (c-1), a represents 1 or 2, and is preferably 1.

$R^2$ represents a base dissociable group.

In the present description and claims, the term "base dissociable group" describes a group that dissociates under the action of an alkali developing solution, thereby improving the solubility of the compound in the alkali developing solution (and preferably describes a group that dissociates under the action of a 2.38% by weight aqueous solution of TMAH at 23° C.). In other words, the fluorine-containing compound (C) of the present invention is a compound that is substantially insoluble in alkali developing solutions, but exhibits increased solubility in alkali developing solutions under the action of the alkali developing solution. Specifically, by including a base dissociable group, the fluorine-containing compound (C) is substantially insoluble in alkali developing solutions, but when the base dissociable group dissociates under the action of an alkali developing solution, a hydrophilic phenolic hydroxyl group (namely, an OH group bonded to $A_N$) is generated, thereby increasing the solubility of the compound in the alkali developing solution.

There are no particular limitations on the base dissociable group provided it satisfies the above definition. However, the structure of the fluorine-containing compound (C) must include at least one fluorine atom among $A_N$ and the a $R^2$ groups. Accordingly, in those cases where the $A_N$ group within the fluorine-containing compound (C) includes no fluorine atoms, at least one $R^2$ group is a base dissociable group having a fluorine atom. In those cases where the $A_N$ group within the fluorine-containing compound (C) includes a fluorine atom, the $R^2$ group may or may not contain a fluorine atom.

As specific examples of the base dissociable group, one or more groups selected from among groups represented by general formulas (II-1) to (II-3) shown below are preferred, and in terms of exhibiting superior effects for the present invention and ease of synthesis, groups represented by general formula (II-1) are particularly preferred.

[Chemical Formula 3]

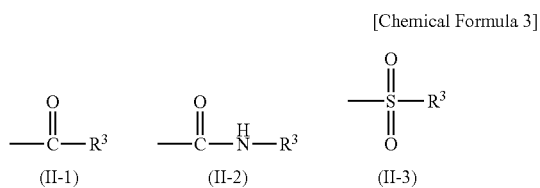

[wherein, each $R^3$ independently represents a hydrocarbon group that may contain a fluorine atom.]

In formula (II-1), $R^3$ represents a hydrocarbon group that may contain a fluorine atom.

The hydrocarbon group represented by $R^3$ may be an unsubstituted hydrocarbon group composed solely of carbon and hydrogen atoms, or a fluorine-substituted hydrocarbon group in which some or all of the hydrogen atoms of the unsubstituted hydrocarbon group have been substituted with fluorine atoms.

The hydrocarbon group is preferably an aliphatic hydrocarbon group, but may be an aromatic hydrocarbon group.

In the present description and claims, the term "aliphatic" is a relative concept used in relation to the term "aromatic", and defines a group or compound or the like that has no aromaticity.

An aliphatic hydrocarbon group is a hydrocarbon group that has no aromaticity. The aliphatic hydrocarbon group may be either saturated or unsaturated, but is preferably saturated. In other words, the aliphatic hydrocarbon group is preferably an unsubstituted alkyl group or a fluorine-substituted alkyl group.

The unsubstituted alkyl group may be a linear, branched or cyclic group, or may be a combination of a linear or branched alkyl group and a cyclic alkyl group.

The unsubstituted linear alkyl group preferably contains 1 to 10 carbon atoms, and more preferably 1 to 8 carbon atoms. Specific examples include a methyl group, ethyl group, n-propyl group, n-butyl group, n-pentyl group, n-hexyl group, n-heptyl group, n-octyl group, n-nonyl group and n-decanyl group.

The unsubstituted branched alkyl group preferably contains 3 to 10 carbon atoms, and more preferably 3 to 8 carbon atoms. As the branched alkyl group, tertiary alkyl groups are preferred, and groups represented by general formula (c-2) shown below are particularly desirable.

[Chemical Formula 4]

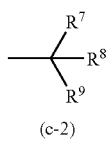

(c-2)

[wherein, $R^7$ to $R^9$ each independently represents a linear alkyl group of 1 to 5 carbon atoms.]

Each alkyl group represented by $R^7$ to $R^9$ is preferably an ethyl group or methyl group, and is most preferably a methyl group.

The unsubstituted cyclic alkyl group preferably contains 4 to 15 carbon atoms, and examples thereof include groups in which one hydrogen atom has been removed from a monocycloalkane, or a polycycloalkane such as a bicycloalkane, tricycloalkane or tetracycloalkane. Specific examples include monocycloalkyl groups such as a cyclopentyl group and cyclohexyl group, and polycycloalkyl groups such as an adamantyl group, norbornyl group, isobornyl group, tricyclodecanyl group and tetracyclododecanyl group.

Examples of the combination of an unsubstituted linear or branched alkyl group and a cyclic alkyl group include groups in which a cyclic alkyl group is bonded to a linear or branched alkyl group as a substituent, and groups in which a linear or branched alkyl group is bonded to a cyclic alkyl group as a substituent.

Examples of the fluorine-substituted alkyl group include groups in which some or all of the hydrogen atoms within an unsubstituted alkyl group described above have been substituted with fluorine atoms.

The fluorine-substituted alkyl group may be either a group in which some of the hydrogen atoms of the unsubstituted alkyl group have been substituted with fluorine atoms, or a group in which all of the hydrogen atoms of the unsubstituted alkyl group have been substituted with fluorine atoms (namely, a perfluoroalkyl group).

As the fluorinated alkyl group for $R^3$, a linear or branched fluorine-substituted alkyl group is preferred, and a group represented by a formula —$R^{41}$-$R^{42}$ [wherein, $R^{41}$ represents an unsubstituted alkylene group of 1 to 9 carbon atoms, and $R^{42}$ represents a fluorine-substituted alkyl group of 1 to 9 carbon atoms, provided that the combined number of carbon atoms within $R^{41}$ and $R^{42}$ is not more than 10] is particularly preferred.

In the above formula, $R^{41}$ is preferably a linear or branched alkylene group of 1 to 5 carbon atoms, and is more preferably a methylene group, ethylene group or propylene group.

$R^{42}$ is preferably a linear or branched fluorine-substituted alkyl group of 1 to 5 carbon atoms, and a perfluoroalkyl group is particularly desirable. Of such groups, a trifluoromethyl group or tetrafluoroethyl group is particularly preferred.

In formula (c-1), $A_N$ represents a naphthalene ring that may have a substituent.

In the group $A_N$, examples of the substituent that may be bonded to the naphthalene ring include a halogen atom, alkyl group, alkoxy group, halogenated lower alkyl group or oxygen atom (=O). Examples of the halogen atom include a fluorine atom, chlorine atom, iodine atom or bromine atom.

In the present invention, the naphthalene ring preferably either has no substituents, or has at least one fluorine atom as a substituent.

As described above, in the structure of the fluorine-containing compound (C), at least one among $A_N$ and the a $R^2$ groups must include a fluorine atom. Accordingly, in those cases where $R^2$ contains a fluorine atom, $A_N$ may or may not contain a fluorine atom. Furthermore, in those cases where $R^2$ contains no fluorine atoms, $A_N$ includes a fluorine atom.

In those cases where the naphthalene ring contains at least one fluorine atom as a substituent, the fluorination ratio for the naphthalene ring, namely the ratio (%) of the number of fluorine atoms relative to the combined number of hydrogen atoms and fluorine atoms contained within the naphthalene ring, is preferably within a range from 10 to 100%, more preferably from 50 to 100%, and is most preferably 100%. In other words, those groups where all of the hydrogen atoms within the naphthalene ring have been substituted with fluorine atoms are the most desirable.

In formula (c-1), the bonding position of $R^X$ on the naphthalene ring of $A_N$ is not particularly limited, although position 1 or position 2 on the naphthalene ring is preferred, and position 2 is the most desirable. Further, the bonding position of —$OR^2$ is also not particularly limited, although positions 5 to 8 on the naphthalene ring are preferred, and position 5 or position 6 is more preferred.

In formula (c-1), $R^X$ may be either a high molecular weight organic group composed of a plurality of structural units, or a low molecular weight organic group. In other words, the fluorine-containing compound (C) of the present invention may be either a polymeric compound (a polymer or copolymer), or a low molecular weight compound (a non-polymer).

In the following description, in those cases where the fluorine-containing compound (C) is a low molecular weight compound, the fluorine-containing compound (C) is frequently referred to as the "fluorine-containing compound (C0)". Further, in those cases where the fluorine-containing compound (C) is a polymeric compound, the fluorine-containing compound (C) is frequently referred to as the "fluorine-containing compound (C1)".

[Fluorine-Containing Compound (C0)]

In the fluorine-containing compound (C0), as the group $R^X$, a substituent containing a polymerizable group is preferred.

The polymerizable group is a group that makes the compound containing the polymerizable group able to undergo polymerization such as radical polymerization. As the polymerizable group, the types of polymerizable groups generally used in monomers can be used. Examples of the polymerizable group include groups containing an ethylenic unsaturated double bond.

Specific examples of groups containing an ethylenic unsaturated double bond include groups represented by $CH_2=C(R^{03})-(CH_2)_b-$ and groups represented by $CH_2=C(R^{03})-C(=O)-O-$. Of these, groups represented by $CH_2=C(R_{03})-(CH_2)_b-$ and groups represented by $CH_2=C(R^{03})-C(=O)-O-$ are preferred.

In the above formulas, $R^{03}$ represents a hydrogen atom, a lower alkyl group, or a halogenated lower alkyl group.

Specific examples of the lower alkyl group for $R^{03}$ include linear or branched lower alkyl groups such as a methyl group, ethyl group, propyl group, isopropyl group, n-butyl group, isobutyl group, tert-butyl group, pentyl group, isopentyl group or neopentyl group.

Specific examples of the halogenated lower alkyl group for $R^{03}$ include groups in which some or all of the hydrogen atoms in an aforementioned lower alkyl group have been substituted with halogen atoms. Examples of the halogen atom include a fluorine atom, chlorine atom, bromine atom and iodine atom, and a fluorine atom is particularly preferred.

$R^{03}$ is preferably a hydrogen atom, a lower alkyl group or a fluorinated lower alkyl group, and is more preferably a hydrogen atom or a methyl group.

b represents an integer of 0 to 2, is preferably 0 or 1, and is most preferably 0.

The substituent containing a polymerizable group may be a group composed solely of the polymerizable group, or a group composed of the polymerizable group and another group besides the polymerizable group.

Examples of groups composed of a polymerizable group and another group besides the polymerizable group include groups formed from an above-mentioned polymerizable group and a divalent linking group. Examples of the divalent linking group include hydrocarbon groups and groups containing a hetero atom.

Examples of the hydrocarbon group include alkylene groups. This alkylene group may be either linear or branched. The number of carbon atoms within the alkylene group is preferably within a range from 1 to 12, more preferably from 1 to 5, and most preferably from 1 to 3.

Specific examples of the alkylene group include a methylene group [—$CH_2$—]; alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; an ethylene group [—$CH_2CH_2$—]; alkylethylene groups such as —$CH(CH_3)CH_2$—, —$CH(CH_3)CH(CH_3)$—, —$C(CH_3)_2CH_2$— and —$CH(CH_2CH_3)CH_2$—; a trimethylene group (n-propylene group) [—$CH_2CH_2CH_2$—]; alkyltrimethylene groups such as —$CH(CH_3)CH_2CH_2$— and —$CH_2CH(CH_3)CH_2$—; a tetramethylene group [—$CH_2CH_2CH_2CH_2$—]; alkyltetramethylene groups such as —$CH(CH_3)CH_2CH_2CH_2$— and —$CH_2CH(CH_3)CH_2CH_2$—, and a pentamethylene group [—$CH_2CH_2CH_2CH_2CH_2$—].

A hetero atom refers to an atom other than a carbon atom or hydrogen atom, and examples thereof include an oxygen atom, nitrogen atom, sulfur atom or halogen atom.

Examples of groups containing a hetero atom include —O—, —C(=O)—, —C(=O)—O—, —NH—, —$NR^{04}$— (wherein, $R^{04}$ is an alkyl group), —NH—C(=O)—, =N—, and groups composed of a combination of one or more of these groups and a divalent hydrocarbon group.

In the present invention, $R^X$ is preferably a group represented by a general formula: $CH_2=C(R^{03})-(CH_2)_b-$ or a group represented by a general formula: $CH_2=C(R^{03})-C(=O)-O-$. In these formulas, $R^{03}$ and b are as defined above.

As the fluorine-containing compound (C0), compounds represented by general formula (c0-1) shown below (hereafter referred to as "compound (C0-1)"), and compounds represented by general formula (c0-2) shown below (hereafter referred to as "compound (C0-2)") are preferred,

[Chemical Formula 5]

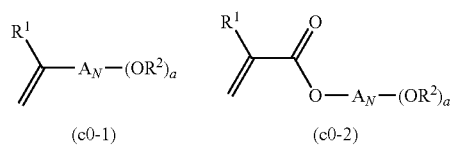

(c0-1)    (c0-2)

[wherein, $R^1$ represents a hydrogen atom, a lower alkyl group or a halogenated lower alkyl group, and $A_N$, $R^2$ and a are as defined above.]

Examples of $R^1$ include the same groups as those exemplified above for $R^{03}$. $R^1$ is preferably a hydrogen atom, a lower alkyl group or a fluorinated lower alkyl group, and is more preferably a hydrogen atom or a methyl group.

As the compound (C0-1), compounds represented by general formula (c0-11) shown below are preferred.

As the compound (C-02), compounds represented by general formula (c0-21) shown below are preferred.

[Chemical Formula 6]

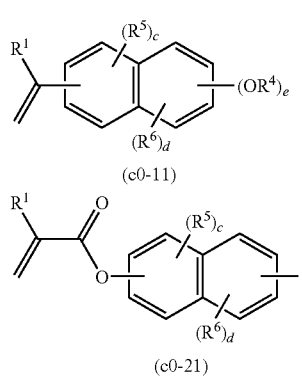

(c0-11)

(c0-21)

[wherein, $R^1$ is as defined above, $R^4$ represents a base dissociable group containing a fluorine atom, $R^5$ and $R^6$ each independently represents a substituent, c is an integer of 0 to 3, d is an integer of 0 to 3, and e is 1 or 2, provided that d+e is an integer of 1 to 4.]

Examples of $R^4$ include those groups exemplified above for the base dissociable group of $R^2$ in general formula (c-1) that also contain a fluorine atom.

Examples of the substituents for $R^5$ and $R^6$ include the same groups as those exemplified above for the substituent that may be bonded to the naphthalene ring in the group $A_N$ within general formula (c-1), and of these, a fluorine atom is preferred.

In formulas (c0-11) and (c0-21), if due consideration is given to factors such as ease of production, then compounds in which either both c and d are 0, or c is 3, $R^5$ is a fluorine atom, d is 4-e, and $R^6$ is a fluorine atom are preferred.

As the compound (C0-1), compounds represented by general formula (c0-11-1) shown below are particularly desirable.

As the compound (C0-2), compounds represented by general formula (c0-21-1) shown below are particularly desirable.

[Chemical Formula 7]

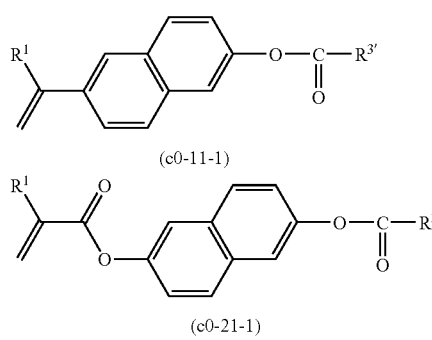

(c0-11-1)

(c0-21-1)

[wherein, $R^1$ is as defined above, and $R^{3'}$ represents a hydrocarbon group containing a fluorine atom.]

Examples of $R^{3'}$ include those groups among the hydrocarbon groups that may contain a fluorine atom exemplified above for $R^3$ in general formula (II-1) that do contain a fluorine atom. Fluorine-substituted branched alkyl groups are particularly preferred, and fluorine-substituted tertiary alkyl groups or groups represented by the above-mentioned formula: $-R^{41}-R^{42}$ are even more desirable. As the fluorine-substituted tertiary alkyl groups, groups represented by general formula (c-2) above are the most desirable.

The fluorine-containing compound (C0) can be used favorably, without modification, as an additive for a resist composition.

Further, in those cases where the fluorine-containing compound (C0) is a compound that includes a polymerizable group, such as the above-mentioned compounds (CO-1) and (CO-2), the fluorine-containing compound (C0) may be converted to a polymeric compound, either by homopolymerization or by copolymerization with one or more other polymerizable compounds. In a similar manner to the fluorine-containing compound (C0), this polymeric compound can be used favorably as an additive for a resist composition for immersion exposure.

Of the compounds described above, the compound (C0-1) and the compound (C0-2) are also useful for producing the fluorine-containing compound (C1) described below.

[Fluorine-Containing Compound (C1)]

Examples of the fluorine-containing compound (C1) include polymeric compounds having structural units derived from an aforementioned fluorine-containing compound (C0) in which $R^X$ is a group containing a polymerizable group.

Specific preferred examples include polymeric compounds having a structural unit represented by general formula (c1-1) or (c1-2) shown below (hereafter frequently referred to as a "structural unit (c1)").

[Chemical Formula 8]

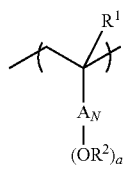

(c1-1)

(c1-2)

[wherein, $R^1$, $A_N$, $R^2$ and a are as defined above.]

As the structural unit (c1), structural units represented by general formulas (c1-11) and (c1-21) shown below are preferred.

[Chemical Formula 9]

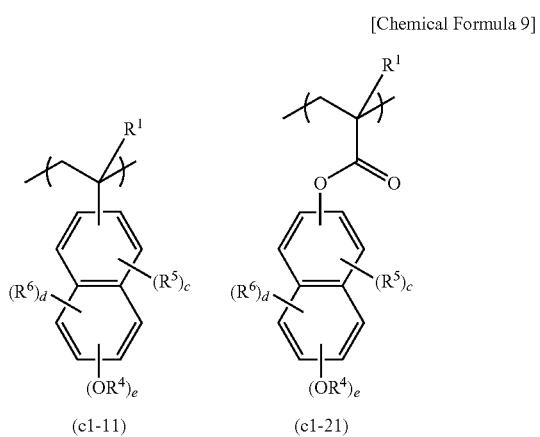

(c1-11)    (c1-21)

[wherein, $R^1$, $R^4$ to $R^6$, c, d and e are as defined above.]

As the structural unit (c1), structural units represented by general formulas (c1-11-1) and (c1-21-1) shown below are particularly desirable.

[Chemical Formula 10]

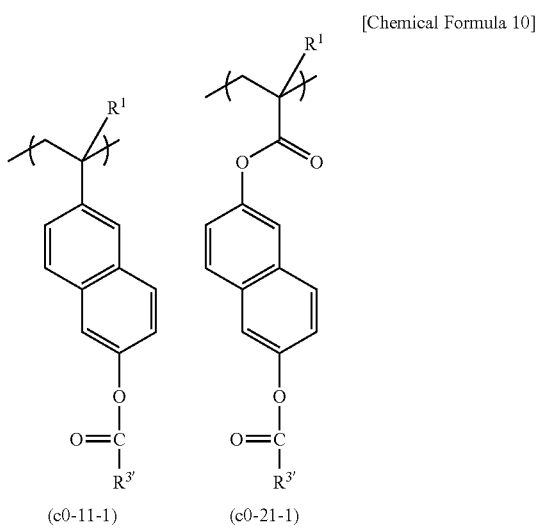

(c0-11-1)    (c0-21-1)

[wherein, $R^1$ and $R^{3'}$ are as defined above.]

In the fluorine-containing compound (C1), one type of structural unit may be used as the structural unit (c1), or two or more types may be used in combination.

The proportion of the structural unit (c1) within the fluorine-containing compound (C1), relative to the combined total of all the structural units that constitute the fluorine-containing compound (C1), is preferably within a range from 10 to 100 mol %, more preferably from 30 to 100 mol %, still more preferably from 50 to 100 mol %, and still more preferably from 60 to 100 mol %. The proportion may be 100 mol %.

The fluorine-containing compound (C1) may also include other structural units besides the structural unit (c1), with the proviso that the effects of the present invention are not impaired. There are no particular limitations on these other structural units, although structural units derived from compounds that are capable of copolymerization with the compound that gives rise to the structural unit (c1) (such as the above-mentioned compounds (C0-1) and (C0-2) or precursors thereto) are preferred, Examples of these other structural units include structural units (a1) to (a4), which are potential structural units for a resin component (A1) of a resist composition for immersion exposure described below, structural units derived from hydroxystyrene, and structural units derived from styrene.

Examples of precursors to the compound (C0-1) and the compound (C0-2) include compounds in which the —$OR^2$ group within each compound has been substituted with —OH (namely, naphthol compounds).

The weight average molecular weight (Mw) (the polystyrene equivalent value determined by gel permeation chromatography) of the polymeric compound (C1) is not particularly limited, but is preferably 2,000 to 50,000, more preferably 3,000 to 30,000, and most preferably 5,000 to 20,000. By making the weight average molecular weight less than the upper limit of the above-mentioned range, the compound (C1) exhibits satisfactory solubility in a resist solvent when used as a resist. On the other hand, making the weight average molecular weight larger than the lower limit of the above-mentioned range yields a more favorable dry etching resistance and cross-sectional shape for the resist pattern.

Further, the dispersity (Mw/Mn) is preferably 1.0 to 5.0, more preferably 1.0 to 3.0, and most preferably 1.2 to 2.5. Here, Mn is the number average molecular weight.

The polymeric compound (C1) can be used favorably as an additive for a resist composition for immersion exposure, <Method of Producing Fluorine-Containing Compound (C)>

The fluorine-containing compound (C) of the present invention can be produced, for, example, by introducing a group represented by $R^2$ at the —OH group of a compound represented by $R^X$-$A_N$-$(OH)_a$ (namely, by substituting the hydrogen atom of an —OH group with $R^2$).

This introduction of the group represented by $R^2$ can be conducted using conventional methods. Using the case where $R^2$ is a group represented by the above general formula (II-1) as an example, a compound (C-1) in which the group $R^2$ within general formula (c-1) is a group represented by general formula (II-1) can be produced by reacting a compound represented by general formula (I) shown below (hereafter frequently referred to as "compound (I)"), and a compound (II) represented by general formula (II) shown below.

[Chemical Formula 11]

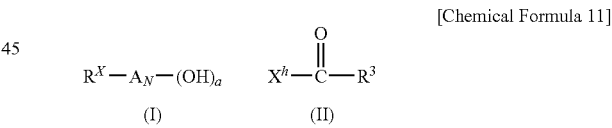

(I)    (II)

[wherein, $R^X$, $A_N$, a and $R^3$ are as defined above, and $X^h$ represents a halogen atom or a hydroxyl group.]

Examples of the halogen atom represented by $X^h$ include a bromine atom, chlorine atom, iodine atom or fluorine atom. As $X^h$, a bromine atom or chlorine atom is preferred as they offer superior reactivity, and a chlorine atom is particularly desirable.

There are no particular limitations on the method used for reacting the compound (I) and the compound (II), and for example, a method may be used in which the compound (I) and the compound (II) are brought into contact within a reaction solvent, in the presence of a base. In the case where $X^h$ represents a halogen atom, this method may be conducted by adding the compound (II), in the presence of a base, to a solution prepared by dissolving the compound (I) in a reaction solvent. Further, in the case where $X^h$ represents a hydroxyl group, the compound (I) and the compound (II) can be reacted (via a condensation reaction) by adding the compound (I), in the presence of a base and a condensation agent, to a solution prepared by dissolving the compound (II) in a reaction solvent. Further, when $X^h$ represents a hydroxyl group, the compound (I) and the compound (II) may also be reacted (via a condensation reaction) by adding the compound (I), in the presence of an acid, to a solution prepared by dissolving the compound (II) in a reaction solvent.

As the compound (I) and the compound (II), either commercially available products or synthesized compounds may be used.

The compound (I) may be either a low molecular weight compound such as a vinylnaphthol, or a polymeric compound that includes a hydroxynaphthol group on a side chain (such as a polyvinylnaphthol).

As the reaction solvent, any solvent that is capable of dissolving the compound (I) and the compound (II) that act as the raw materials may be used, and specific examples include tetrahydrofuran (THF), acetone, dimethylformamide (DMF), dimethylacetamide, dimethylsulfoxide (DMSO) and acetonitrile.

Examples of the base include organic bases such as triethylamine, 4-dimethylaminopyridine (DMAP) and pyridine, and inorganic bases such as sodium hydride, $K_2CO_3$ and $Cs_2CO_3$.

As the acid, those acids typically used within dehydration-condensation reactions can be used, and specific examples include inorganic acids such as hydrochloric acid, sulfuric acid and phosphoric acid, and organic acids such as methanesulfonic acid, trifluoromethanesulfonic acid, benzenesulfonic acid and p-toluenesulfonic acid, These acids may be used alone, or in combinations containing two or more different acids.

Examples of the condensation agent include carbodiimide reagents such as 1-ethyl-3-(3-dimethylaminopropyl) carbodiimide hydrochloride (EDCI), dicyclohexylcarboxyimide (DCC), diisopropylcarbodiimide and carbodiimidazole, as well as tetraethyl pyrophosphate and benzotriazole-N-hydroxytrisdimethylaminophosphonium hexafluorophosphate (Bop reagent).

The amount added of the compound (II) relative to the compound (I) is preferably within a range from 1 to 3 equivalents, and more preferably from 1 to 2 equivalents.

The reaction temperature is preferably within a range from −20 to 40° C., and more preferably from 0 to 30° C.

The reaction time varies depending on factors such as the reactivity of the compound (I) and compound (II) and the reaction temperature, but is preferably within a range from 30 to 240 minutes, and more preferably from 60 to 180 minutes.

Further, in those cases where the fluorine-containing compound (C) is a polymeric compound, the compound can be obtained by conducting a conventional radical polymerization or the like of the monomers that give rise to the desired structural units (for example, the above-mentioned compound (C0-1) and compound (C0-2)), using a radical polymerization initiator such as azobisisobutyronitrile (AIBN).

The fluorine-containing compound (C) of the present invention described above is a novel compound that has been unknown until now.

The fluorine-containing compound (C) can be used favorably as an additive for a resist composition, and a resist composition containing the added fluorine-containing compound (C) is useful as a resist composition for immersion exposure.

There are no particular limitations on the resist composition containing the added fluorine-containing compound (C), provided the composition can be used for immersion exposure, although a chemically amplified resist composition including a base component that exhibits changed solubility in an alkali developing solution under the action of acid, and an acid generator component that generates acid upon irradiation is ideal.

The fluorine-containing compound (C) is ideal for use within the resist composition for immersion exposure according to the present invention described below.

<<Resist Composition for Immersion Exposure>>

The resist composition for immersion exposure according to the present invention includes a base component (A) (hereafter, referred to as "component (A)") that exhibits changed solubility in an alkali developing solution under the action of acid, an acid generator component (B) (hereafter, referred to as "component (B)") that generates acid upon irradiation, and a fluorine-containing polymeric compound (C) (hereafter, referred to as "component (C)") containing a group represented by general formula (c-1) shown above and containing at least one fluorine atom.

<Component (A)>

As the component (A), either a single organic compound typically used as a base component for a chemically amplified resist, or a mixture of two or more such organic compounds, may be used.

The term "base component" refers to an organic compound capable of forming a film, and preferably refers to an organic compound having a molecular weight of 500 or more. When the organic compound has a molecular weight of 500 or more, the film-forming ability is improved, and a nano level resist pattern can be readily formed.

The organic compounds having a molecular weight of 500 or more that may be used as the base component are broadly classified into low molecular weight organic compounds having a molecular weight of 500 to less than 2,000 (namely, "low molecular weight materials") and high molecular weight organic compounds having a molecular weight of 2,000 or more (namely, "polymeric materials"). Generally, a non-polymer is used as the low molecular weight material, A resin a (polymer or copolymer) is used as the polymeric material, and the "molecular weight" of the polymeric material refers to the polystyrene equivalent weight average molecular weight determined by GPC (gel permeation chromatography). Hereafter, the simplified term "resin" refers to a resin having a molecular weight of 2,000 or more.

The component (A) may be either a resin that exhibits changed alkali solubility under the action of acid, or a low molecular weight material that exhibits changed alkali solubility under the action of acid.

In those cases where the resist composition for immersion exposure according to the present invention is a negative resist composition, a base component that is soluble in an alkali developing solution is used as the component (A), and a cross-linker is blended into the negative resist composition.

In the negative resist composition, when acid is generated from the component (B) upon exposure, the action of this acid causes cross-linking between the base component and the cross-linker, and the cross-linked portion becomes substantially insoluble in alkali. As a result, during resist pattern formation, when a resist film obtained by applying the negative resist composition to a substrate is selectively exposed, the exposed portions of the resist become insoluble in an alkali developing solution, whereas the unexposed portions remain soluble in the alkali developing solution, meaning a resist pattern can be formed by alkali developing.

As the component (A) of the negative resist composition, a resin that is soluble in an alkali developing solution (hereafter frequently referred to as an "alkali-soluble resin") is usually used.

As the alkali-soluble resin, it is preferable to use a resin having structural units derived from at least one of an α-(hydroxyalkyl)acrylic acid and a lower alkyl ester of an α-(hydroxyalkyl)acrylic acid, as such resins enable the formation of a satisfactory resist pattern with minimal swelling. Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linker, typically, an ammo-based cross-linker such as a glycoluril having a methylol group or alkoxymethyl group is preferable, as it enables the formation of a resist pattern with minimal swelling. The amount of the cross-linker added is preferably within a range from 1 to 50 parts by weight, relative to 100 parts by weight of the alkali-soluble resin.

When the resist composition for immersion exposure according to the present invention is a positive resist composition, as the component (A), a base component that exhibits increased solubility in an alkali developing solution under the action of acid is used. More specifically, the component (A) is substantially insoluble in an alkali developing solution prior to exposure, but when acid is generated from the component (B) upon exposure, the action of this acid causes an increase in the solubility of the base component in an alkali developing solution. Accordingly, during resist pattern formation, when a resist film formed by applying the positive resist composition to a substrate is selectively exposed, the exposed portions change from being substantially insoluble in an alkali developing solution to being alkali-soluble, whereas the unexposed portions remain alkali-insoluble, meaning a resist pattern can be formed by alkali developing.

In the resist composition of the present invention, the component (A) is preferably a base component that exhibits increased solubility in an alkali-developing solution under the action of acid. Namely, the resist composition of the present invention is preferably a positive resist composition.

The component (A) may be a resin component (A1) that exhibits increased solubility in an alkali developing solution under the action of acid (hereafter, frequently referred to as "component (A1)"), a low molecular weight material (A2) that exhibits increased solubility in an alkali developing solution under the action of acid (hereafter, frequently referred to as "component (A2)"), or a mixture thereof.

[Component (A1)]

As the component (A1), either a single resin component (base resin) typically used as a base component for a chemically amplified resist, or a mixture of two or more such resin components, may be used.

In the present invention, as the component (A1), a resin containing a structural unit derived from an acrylate ester is preferred.

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

In the acrylate ester, specific examples of the lower alkyl group for the substituent at the α-position include linear or branched lower alkyl groups such as a methyl group, ethyl group, propyl group, isopropyl group, n-butyl group, isobutyl group, tert-butyl group, pentyl group, isopentyl group and neopentyl group.

Further, specific examples of the halogenated lower alkyl group include groups in which some or all of the hydrogen atoms of the aforementioned "lower alkyl group for the substituent at the α-position" are substituted with halogen atoms. Examples of the halogen atom include a fluorine atom, chlorine atom, bromine atom and iodine atom, and a fluorine atom is particularly desirable.

In the present invention, it is preferable that a hydrogen atom, a lower alkyl group or a halogenated lower alkyl group, and more preferably a hydrogen atom, a lower alkyl group or a fluorinated lower alkyl group, is bonded to the α-position of the acrylate ester. In terms of industrial availability, a hydrogen atom or a methyl group is the most desirable.

The component (A1) preferably has a structural unit (a1) derived from an acrylate ester containing an acid dissociable, dissolution inhibiting group.

Further, in addition to this structural unit (a1), the component (A1) preferably also has a structural unit (a2) derived from an acrylate ester that contains a lactone-containing cyclic group.

Moreover, in addition to the structural unit (a1), or in addition to the combination of the structural units (a1) and (a2), the component (A1) preferably also has a structural unit (a3) derived from an acrylate ester that contains a polar group-containing aliphatic hydrocarbon group.

—Structural Unit (a1):

As the acid dissociable, dissolution inhibiting group within the structural unit (a1), any of the groups that have been proposed as acid dissociable, dissolution inhibiting groups for the base resins of chemically amplified resists can be used, provided the group has an alkali dissolution inhibiting effect that renders the entire component (A1) insoluble in an alkali developing solution prior to dissociation, and then following dissociation under action of acid, increases the solubility of the entire component (A1) in the alkali developing solution. Generally, groups that form either a cyclic or chain-like tertiary alkyl ester with the carboxyl group of (meth)acrylic acid or the like, and acetal-type acid dissociable, dissolution inhibiting groups such as alkoxyalkyl groups are widely known.

Here, a "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of these tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched acid dissociable, dissolution inhibiting group" is not limited to structures constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity. The number of carbon atoms within the group is preferably from 5 to 30.

The "aliphatic cyclic group" within the structural unit (a1) may or may not have a substituent. Examples of substituents include lower alkyl groups of 1 to 5 carbon atoms, a fluorine atom, fluorinated lower alkyl groups of 1 to 5 carbon atoms, and an oxygen atom (=O).

The basic ring of the "aliphatic cyclic group" exclusive of substituents is not limited to structures constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include a 2-methyl-2-adamantyl group and a 2-ethyl-2-adamantyl group. Alternatively, groups having an aliphatic cyclic group such as an adamantyl group, cyclohexyl group, cyclopentyl group, norbornyl group, tricyclodecanyl group or tetracyclododecanyl group, and a branched alkylene group having a tertiary carbon atom bonded thereto, such as the groups bonded to the carbonyloxy group (—C(O)—O—) in the structural units represented by general formulas (a1"-1) to (a1"-6) shown below, may also be exemplified.

[Chemical Formula 12]

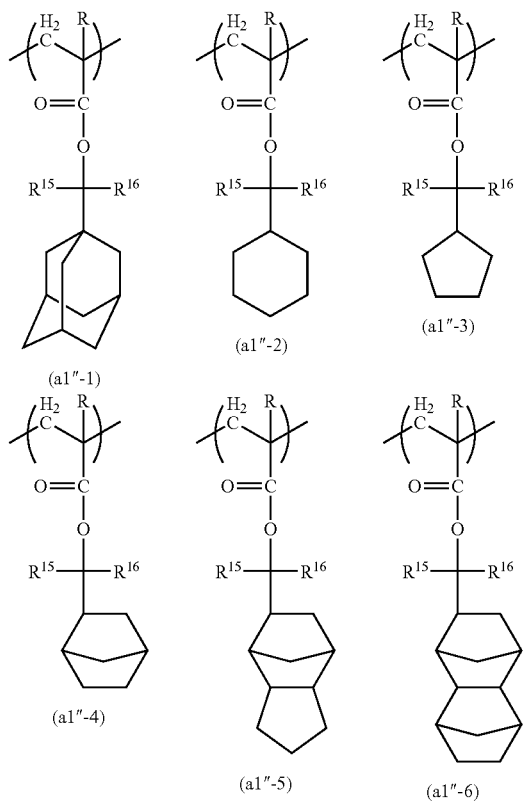

[wherein, R represents a hydrogen atom, a lower alkyl group or a halogenated lower alkyl group; and $R^{15}$ and $R^{16}$ each represents an alkyl group (which may be linear or branched, and preferably has 1 to 5 carbon atoms).]

In general formulas (a1"-1) to (a1"-6) above, the lower alkyl group or halogenated lower alkyl group for R are the same as the lower alkyl group or halogenated lower alkyl group which may be bonded to the α-position of the aforementioned acrylate ester.

An "acetal-type acid dissociable, dissolution inhibiting group" generally substitutes a hydrogen atom at the terminal of an alkali-soluble group such as a carboxyl group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 13]

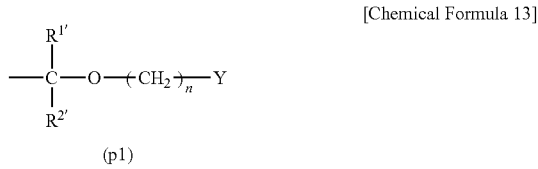

[wherein, $R^{1\prime}$ and $R^{2\prime}$ each independently represents a hydrogen atom or a lower alkyl group, n represents an integer of 0 to 3, and Y represents a lower alkyl group or an aliphatic cyclic group.]

In general formula (p1) above, n is preferably an integer of 0 to 2, more preferably 0 or 1, and most preferably 0.

As the lower alkyl group for $R^{1\prime}$ and $R^{2\prime}$, the same groups as the lower alkyl groups which may be bonded to the α-position of the aforementioned acrylate ester may be exemplified, a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 14]

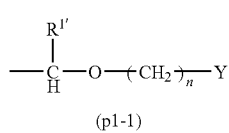

(p1-1)

[wherein $R^{1\prime}$, n and Y are as defined above.]

As the lower alkyl group for Y, the same groups as the lower alkyl groups which may be bonded to the α-position of the aforementioned acrylate ester may be exemplified.

As the aliphatic cyclic group for Y, any of the aliphatic monocyclic or polycyclic groups which have been proposed for conventional ArF resists and the like can be appropriately selected for use. For example, the same groups as those described above in connection with the "aliphatic cyclic group" can be exemplified.

Further, as the acetal-type, acid dissociable, dissolution inhibiting group, groups represented by general formula (p2) shown below can also be exemplified.

[Chemical Formula 15]

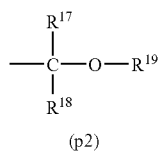

(p2)

[wherein, $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ is bonded to the terminal of $R^{19}$ to form a ring.]

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may both independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and tetrahydrofuranyl group.

As the structural unit (a1), it is preferable to use at least one member selected from the group consisting of structural units represented by general formula (a1-0-1) shown below and structural units represented by general formula (a1-0-2) shown below.

[Chemical Formula 16]

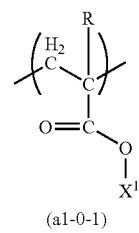

(a1-0-1)

[wherein, R represents a hydrogen atom, a lower alkyl group or a halogenated lower alkyl group; and $X^1$ represents an acid dissociable, dissolution inhibiting group.]

[Chemical Formula 17]

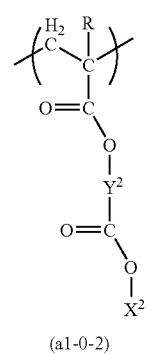

(a1-0-2)

[wherein, R represents a hydrogen atom, a lower alkyl group or a halogenated lower alkyl group; $X^2$ represents an acid dissociable, dissolution inhibiting group; and $Y^2$ represents an alkylene group or an aliphatic cyclic group.]

In general formula (a1-0-1), the lower alkyl group and halogenated lower alkyl group for R are the same as the lower alkyl group and halogenated lower alkyl group which may be bonded to the α-position of the aforementioned acrylate ester.

$X^1$ is not particularly limited, as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as the lower alkyl group or halogenated lower alkyl group which may be bonded to the α-position of the aforementioned acrylate ester.

$X^2$ is the same as $X^1$ in general formula (a1-0-1).

$Y^2$ is preferably an alkylene group of 1 to 10 carbon atoms or a divalent aliphatic cyclic group of 5 to 30 carbon atoms. As the aliphatic cyclic group, the same groups as those exemplified above in connection with the description of the "aliphatic cyclic group" can be used, with the exception that two hydrogen atoms have been removed therefrom.

In those cases where $Y^2$ is an alkylene group of 1 to 10 carbon atoms, the number of carbon atoms within the group is more preferably 1 to 6, still more preferably 1 to 4, and is most preferably 1 to 3.

In those cases where $Y^2$ is a divalent aliphatic cyclic group, groups in which two or more hydrogen atoms have been removed from cyclopentane, cyclohexane, norbornane, isobornane, adamantane, tricyclodecane or tetracyclododecane are preferred.

Specific examples of the structural unit (a1) include structural units represented by general formulas (a1-1) to (a1-4) shown below.

[Chemical Formula 18]

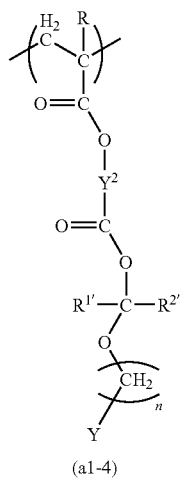

(a1-4)

[wherein, X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene group or an aliphatic cyclic group; R is as defined above; and $R^{1\prime}$ and $R^{2\prime}$ each independently represents a hydrogen atom or a lower alkyl group of 1 to 5 carbon atoms.]

In the above formulas, examples of X' include the same tertiary alkyl ester-type acid dissociable, dissolution inhibiting groups as those exemplified in connection with $X^1$ in general formula (a1-0-1) shown above.

Examples of $R^{1\prime}$, $R^{2\prime}$, n and Y include the same groups exemplified above for $R^{1\prime}$, $R^{2\prime}$, n and Y in general formula (p1) in connection with the description of the aforementioned "acetal-type acid dissociable, dissolution inhibiting groups".

Examples of $Y^2$ include the same groups as those exemplified for $Y^2$ in general formula (a1-0-2) shown above.

Specific examples of structural units represented by general formula (a1-1) to (a1-4) are shown below.

[Chemical Formula 19]

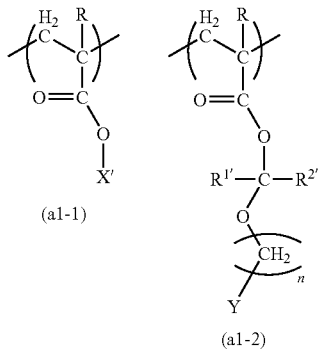

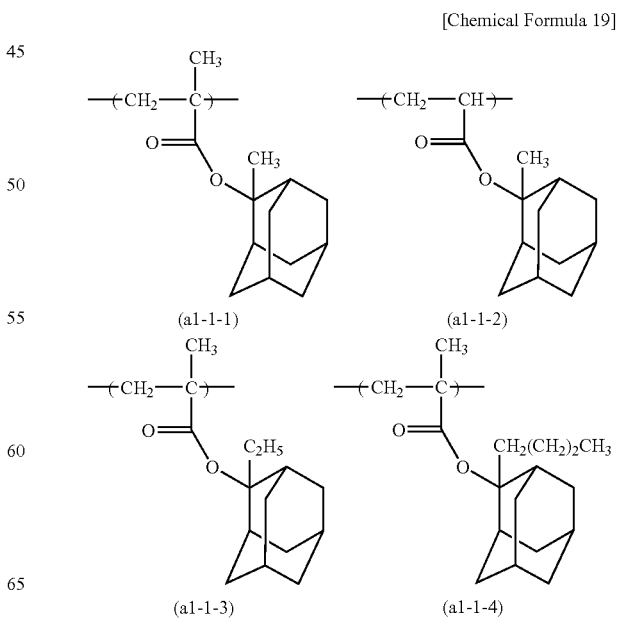

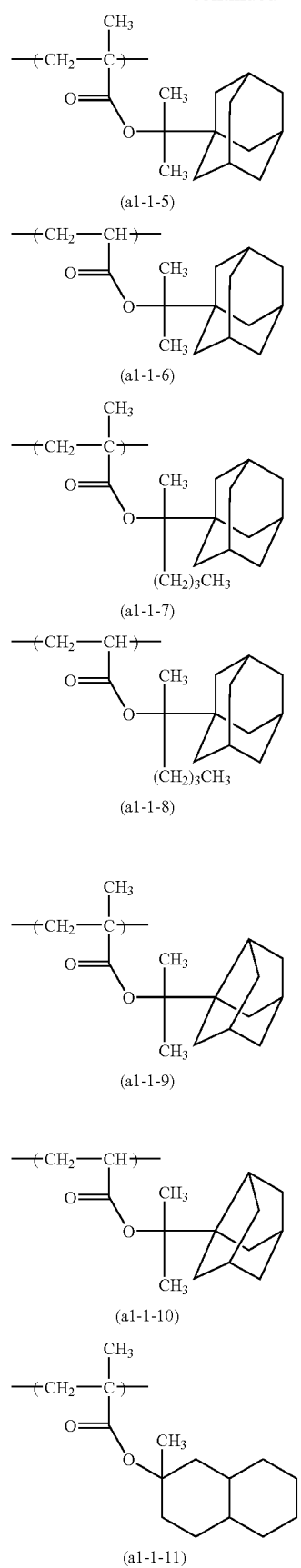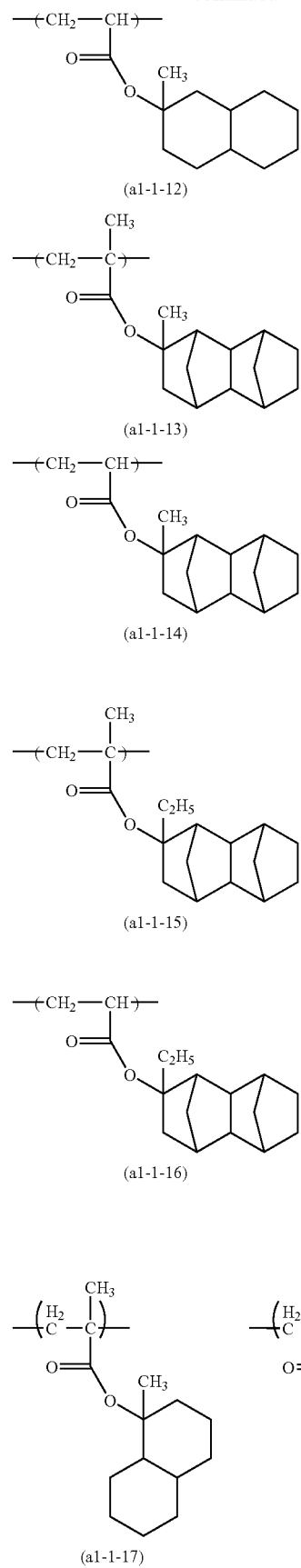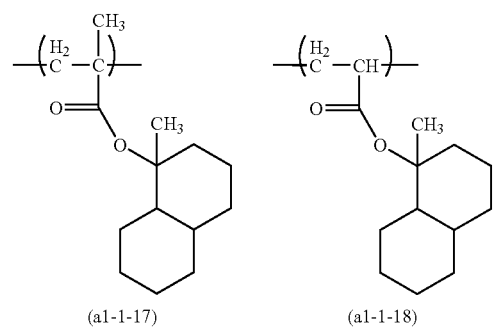

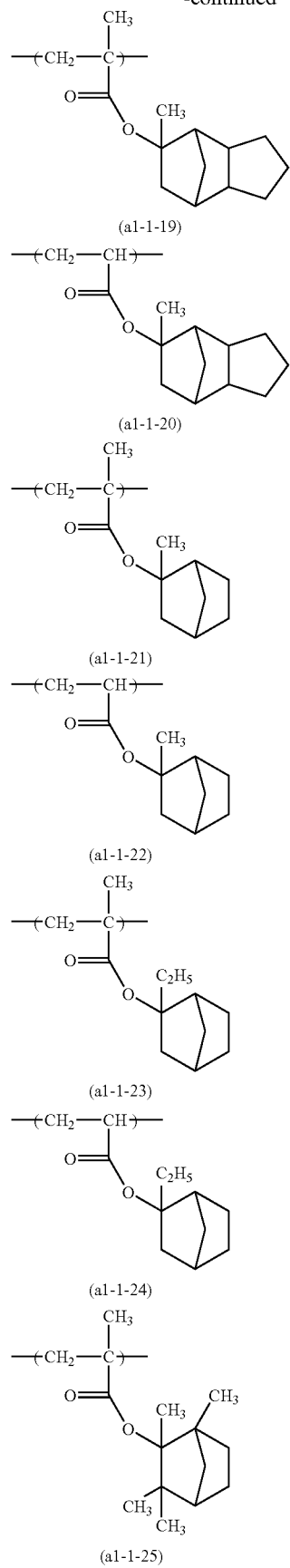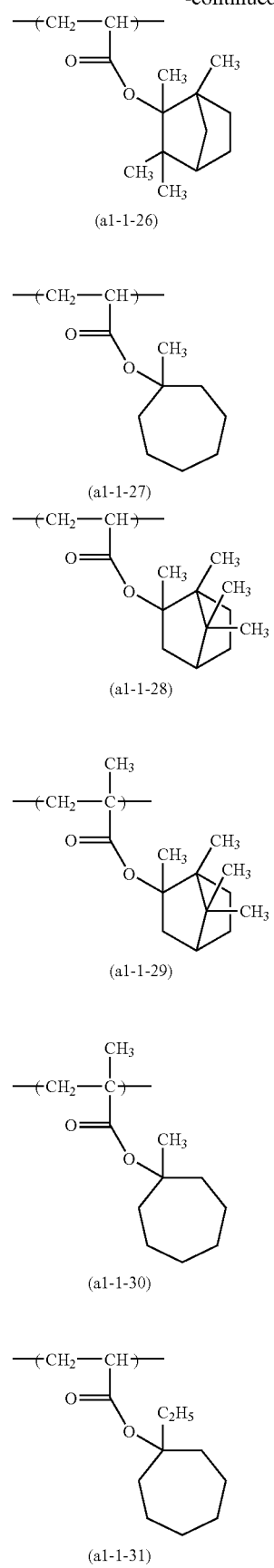

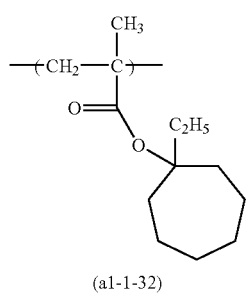
(a1-1-32)
[Chemical Formula 21]
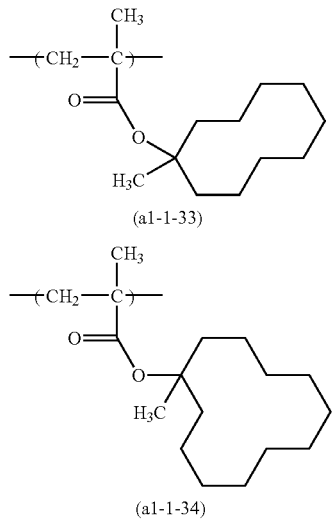
(a1-1-33)
(a1-1-34)
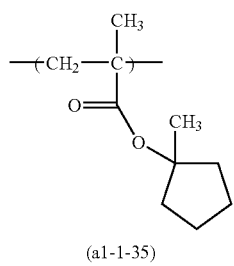
(a1-1-35)
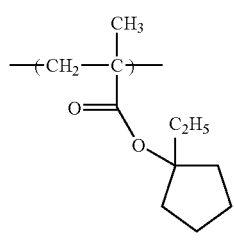
(a1-1-36)
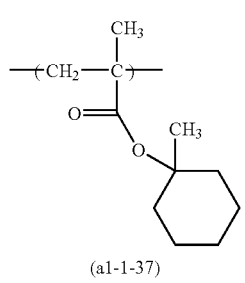
(a1-1-37)  (a1-1-38)
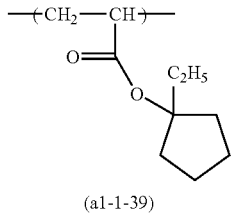
(a1-1-39)  (a1-1-40)
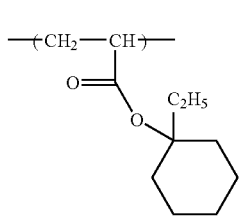
(a1-1-41)  (a1-1-42)
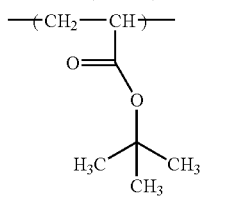
(a1-1-43)
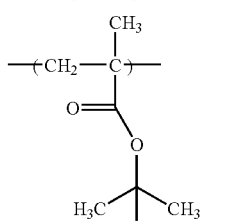
(a1-1-44)
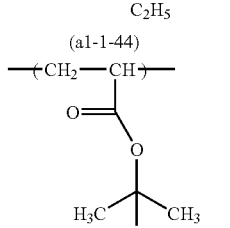
(a1-1-45)
[Chemical Formula 22]
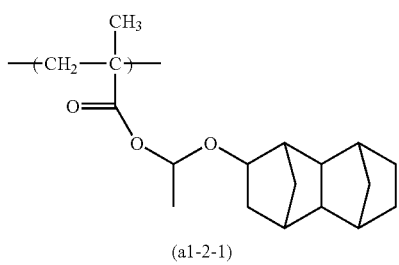
(a1-2-1)
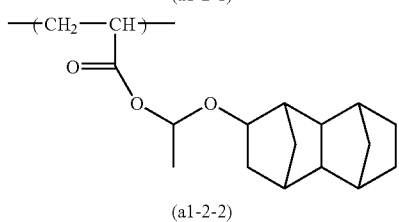
(a1-2-2)

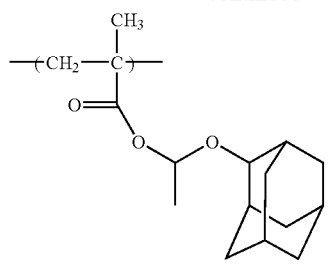
(a1-2-3)
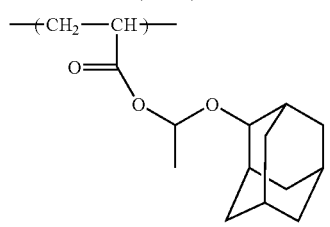
(a1-2-4)
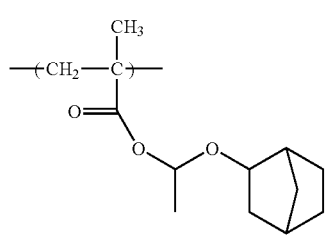
(a1-2-5)
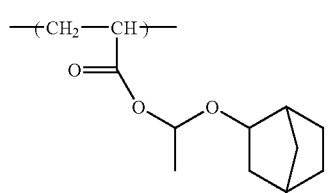
(a1-2-6)
[Chemical Formula 23]
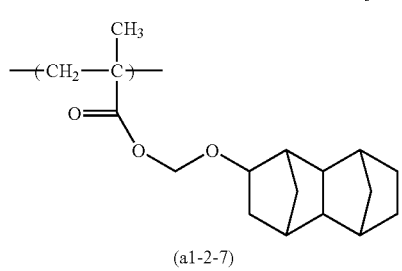
(a1-2-7)
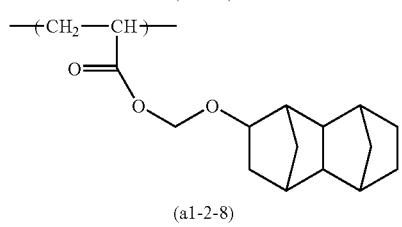
(a1-2-8)
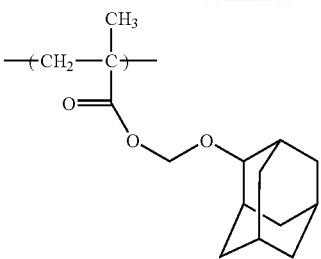
(a1-2-9)
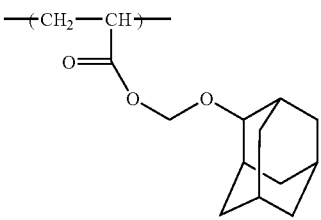
(a1-2-10)
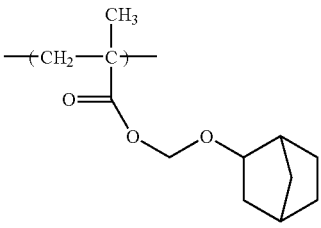
(a1-2-11)
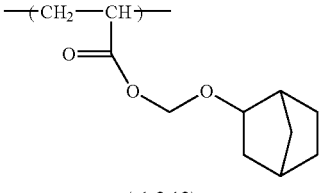
(a1-2-12)
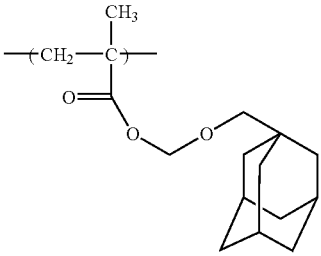
(a1-2-13)
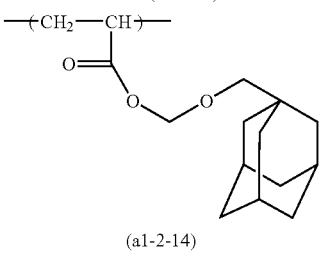
(a1-2-14)

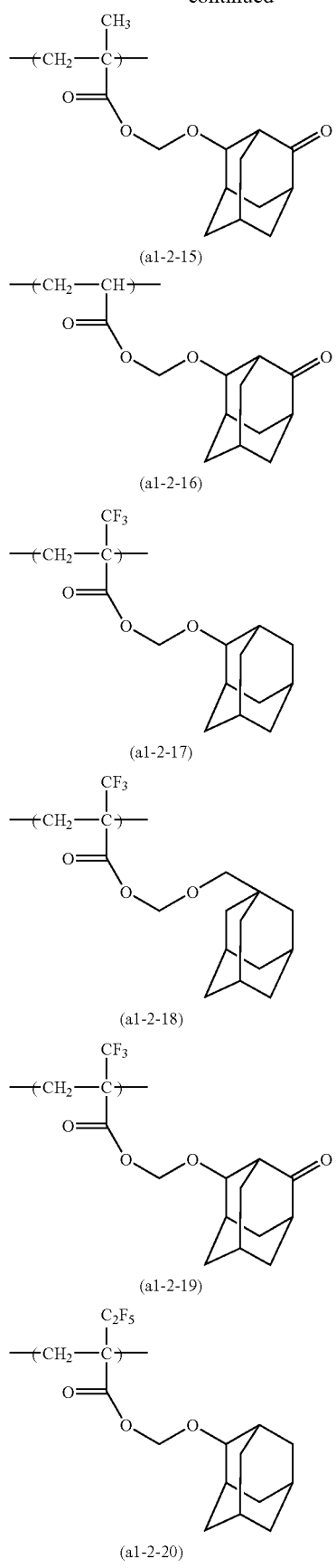
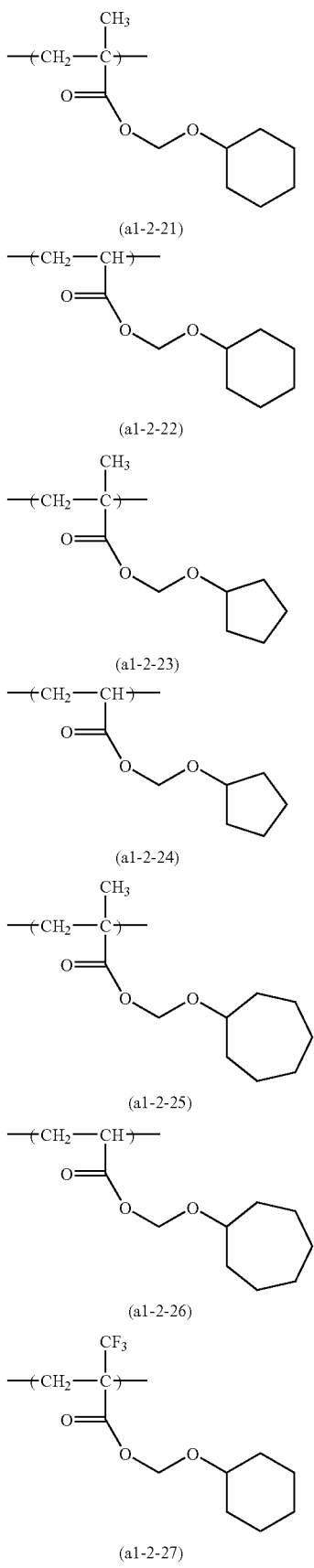

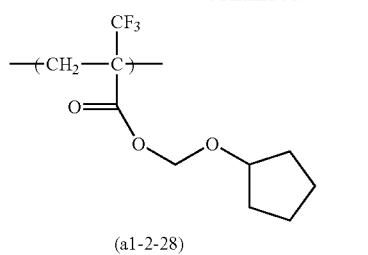
(a1-2-28)
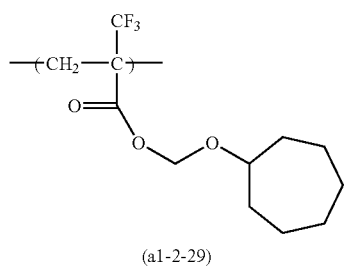
(a1-2-29)
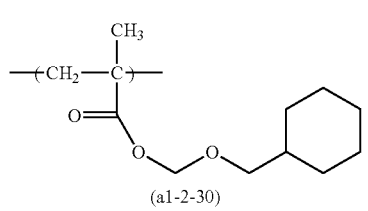
(a1-2-30)
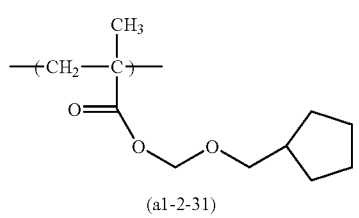
(a1-2-31)
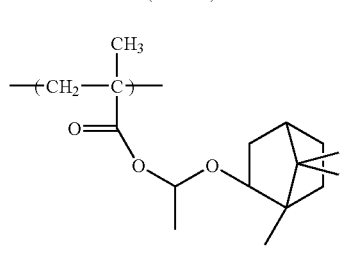
(a1-2-32)
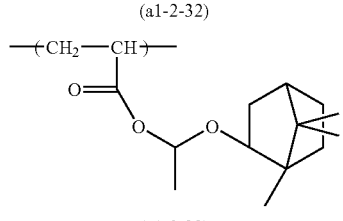
(a1-2-33)
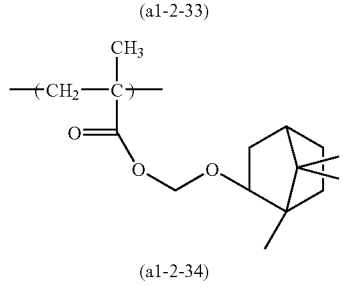
(a1-2-34)
[Chemical Formula 25]
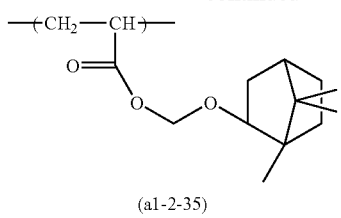
(a1-2-35)
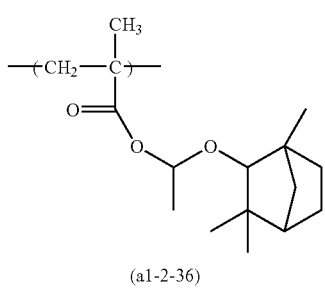
(a1-2-36)
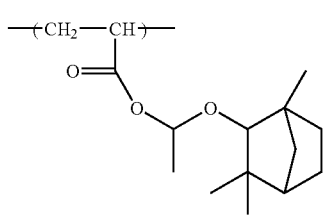
(a1-2-37)
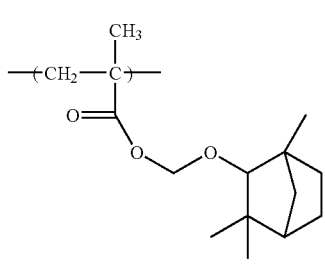
(a1-2-38)
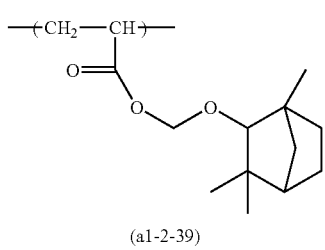
(a1-2-39)

[Chemical Formula 26]
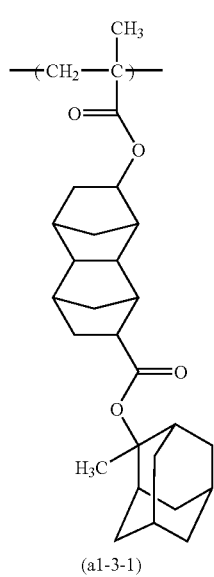
(a1-3-1)
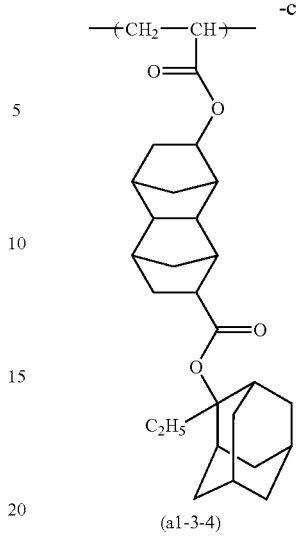
(a1-3-4)
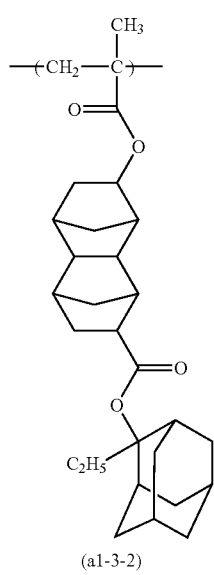
(a1-3-2)
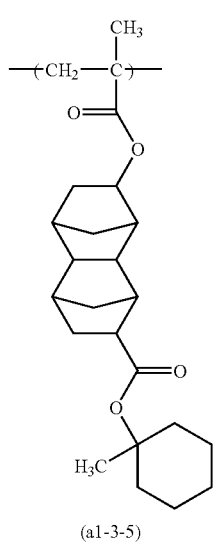
(a1-3-5)
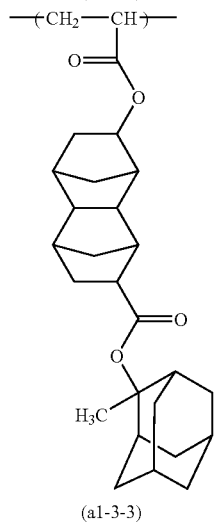
(a1-3-3)
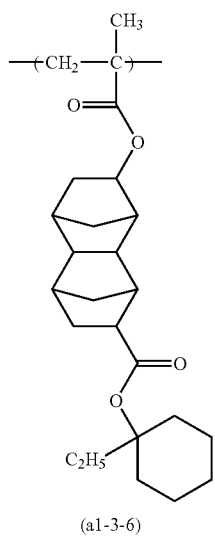
(a1-3-6)

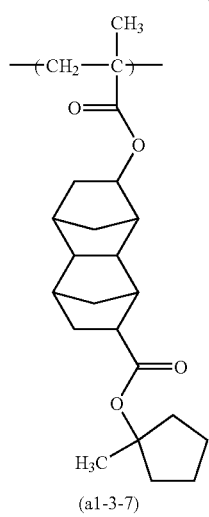
(a1-3-7)
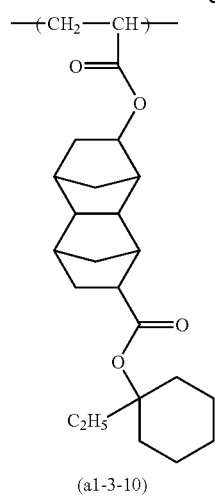
(a1-3-10)
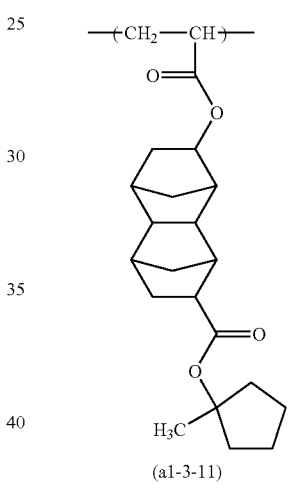
(a1-3-8)
(a1-3-11)
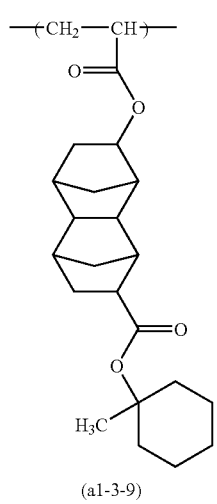
(a1-3-9)
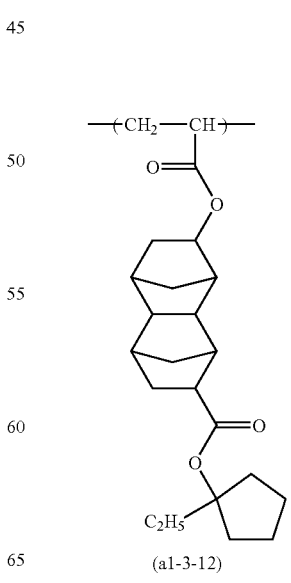
(a1-3-12)

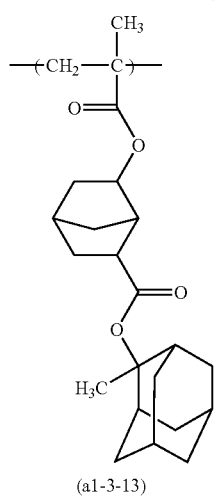
(a1-3-13)
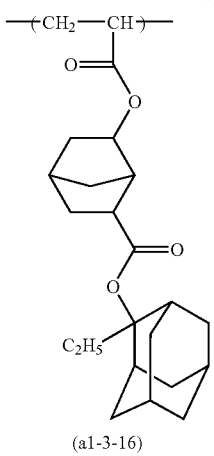
(a1-3-16)
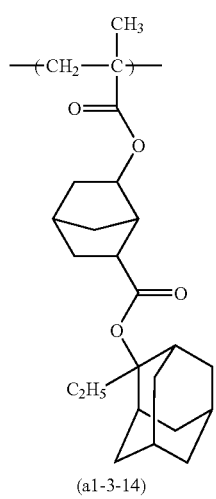
(a1-3-14)
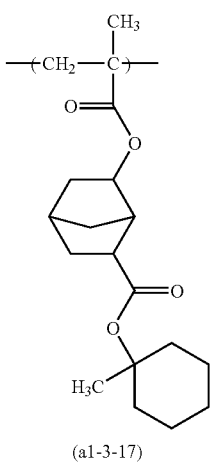
(a1-3-17)
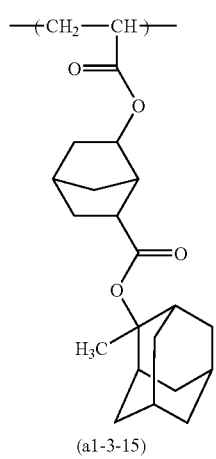
(a1-3-15)
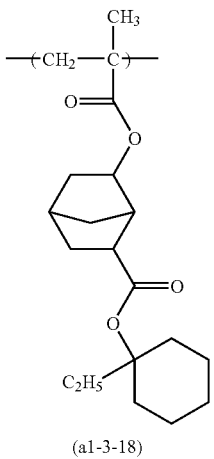
(a1-3-18)

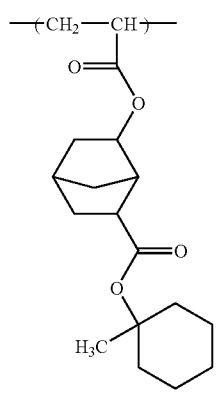
(a1-3-19)
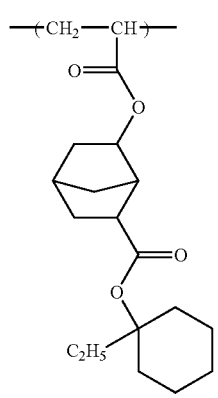
(a1-3-20)
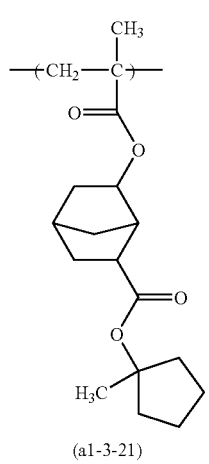
(a1-3-21)
[Chemical Formula 27]
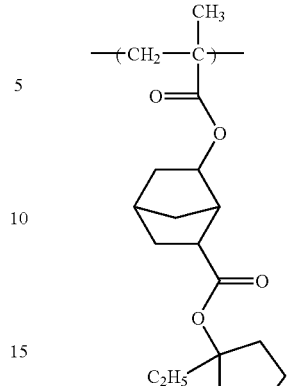
(a1-3-22)
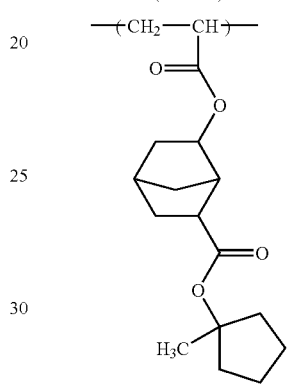
(a1-3-23)
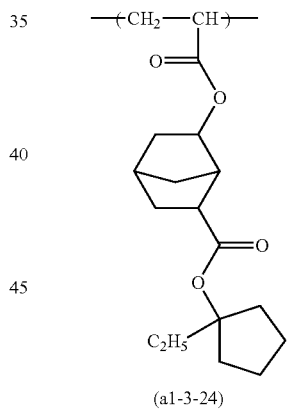
(a1-3-24)
[Chemical Formula 28]
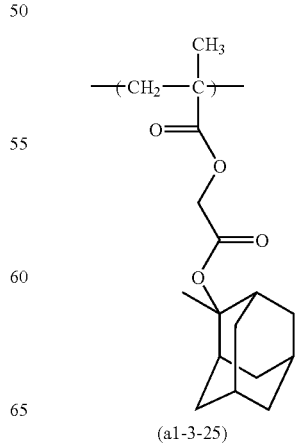
(a1-3-25)

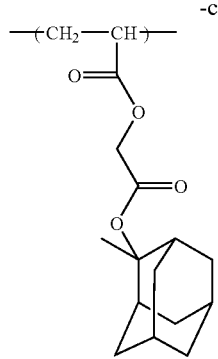
(a1-3-26)
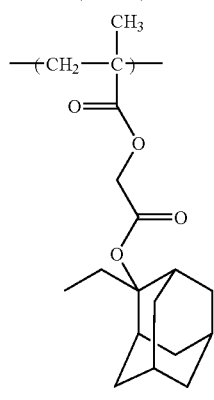
(a1-3-27)
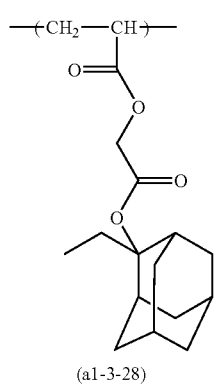
(a1-3-28)
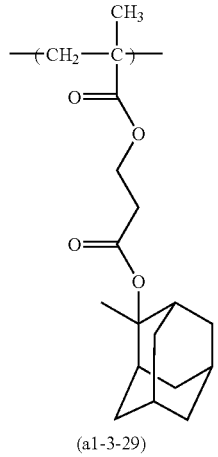
(a1-3-29)
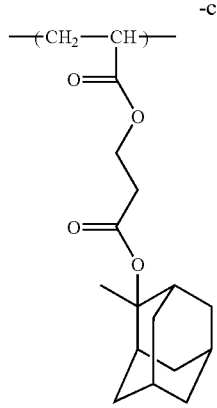
(a1-3-30)
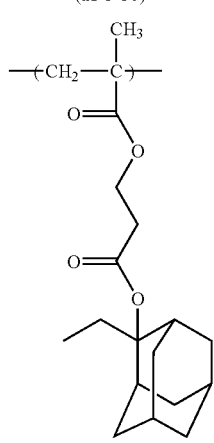
(a1-3-31)
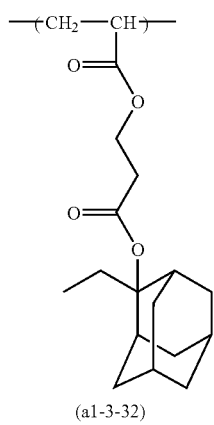
(a1-3-32)
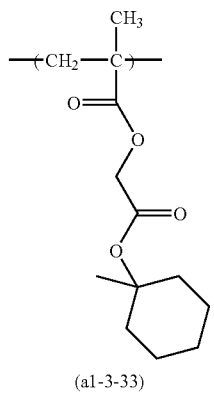
(a1-3-33)

-continued
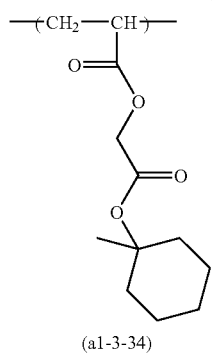
(a1-3-34)
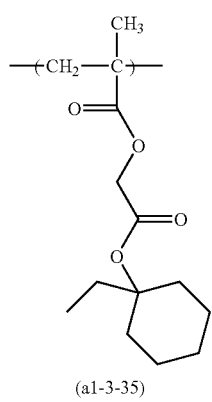
(a1-3-35)
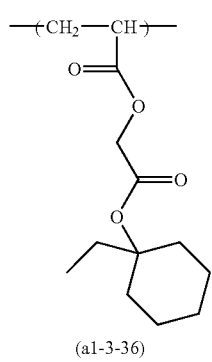
(a1-3-36)
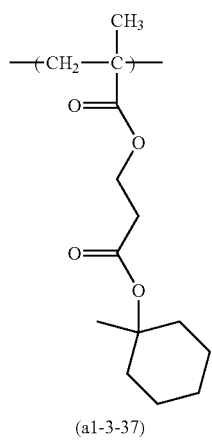
(a1-3-37)
-continued
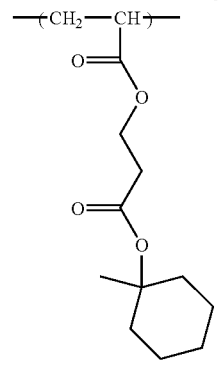
(a1-3-38)
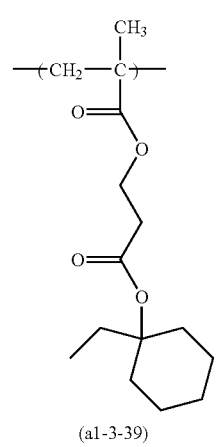
(a1-3-39)
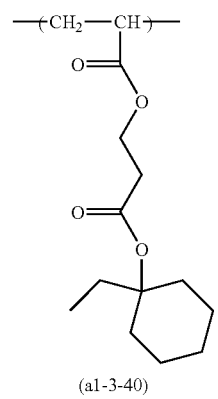
(a1-3-40)
[Chemical Formula 29]
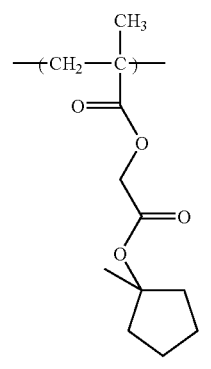
(a1-3-41)

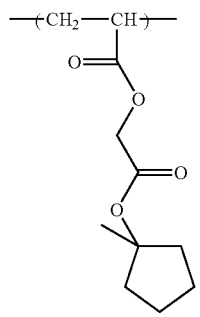
(a1-3-42)
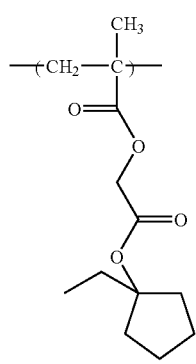
(a1-3-43)
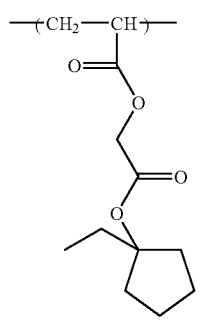
(a1-3-44)
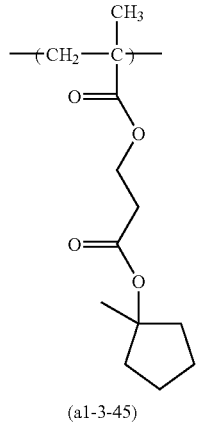
(a1-3-45)
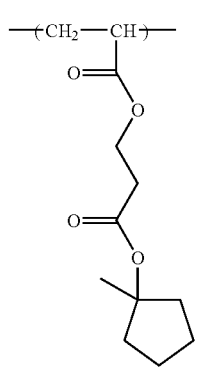
(a1-3-46)
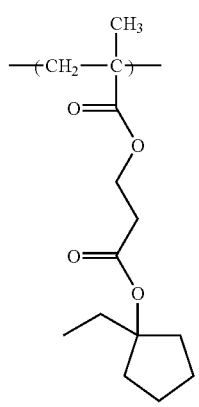
(a1-3-47)
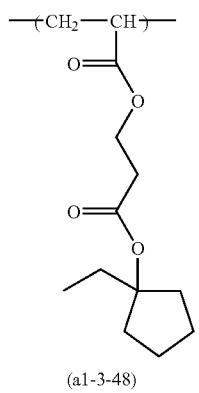
(a1-3-48)
[Chemical Formula 30]
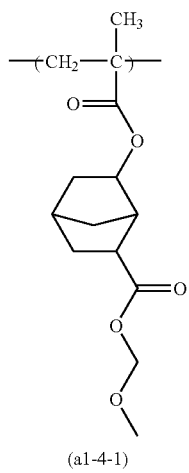
(a1-4-1)

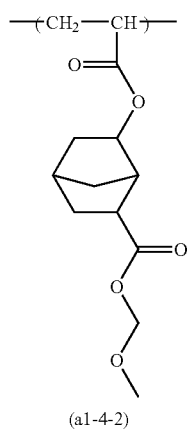
(a1-4-2)
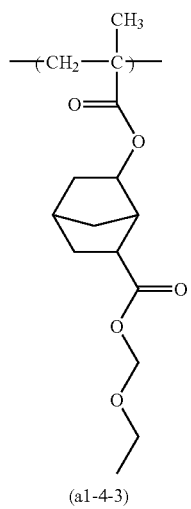
(a1-4-3)
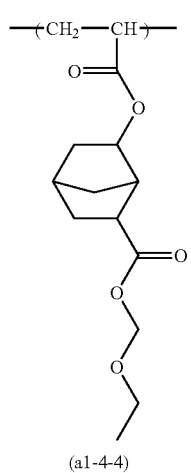
(a1-4-4)
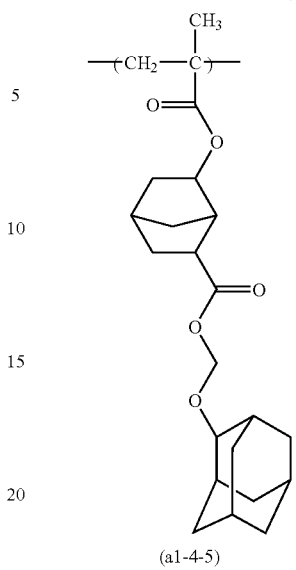
(a1-4-5)
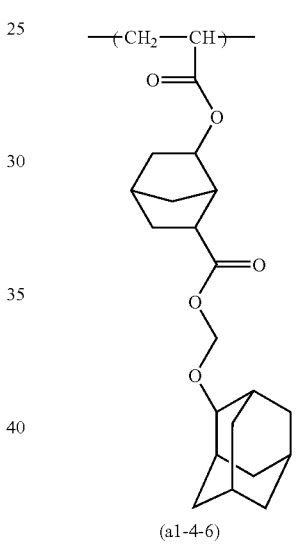
(a1-4-6)
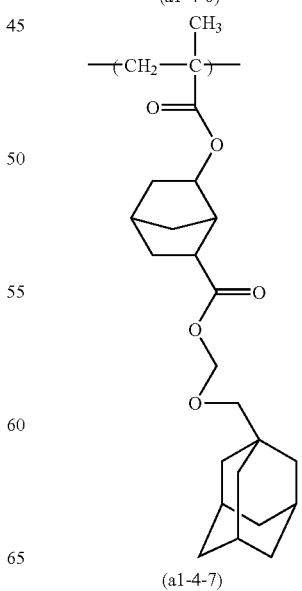
(a1-4-7)

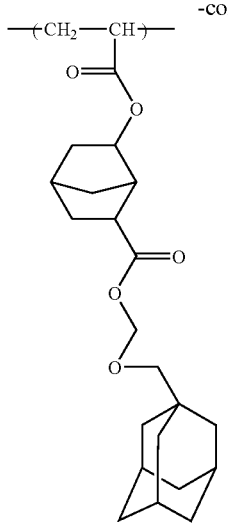
(a1-4-8)
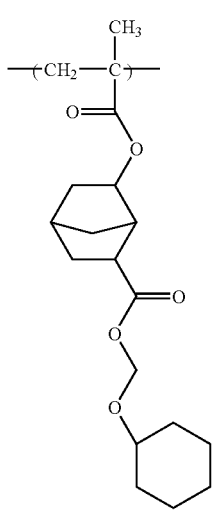
(a1-4-9)
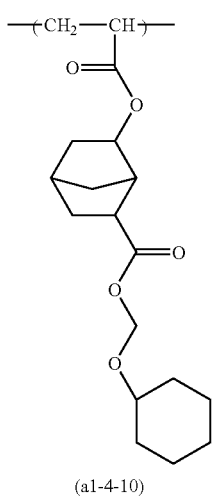
(a1-4-10)
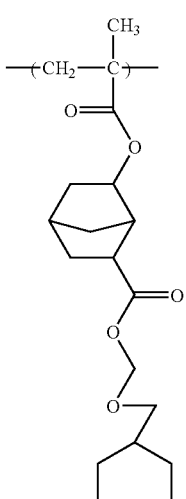
(a1-4-11)
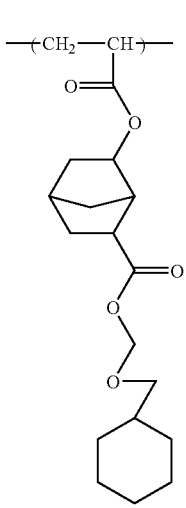
(a1-4-12)
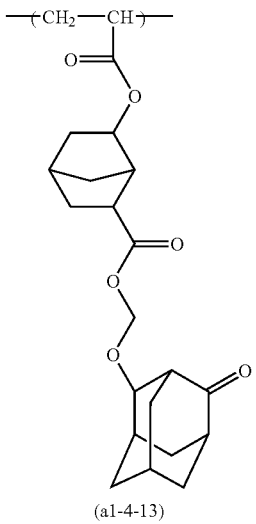
(a1-4-13)

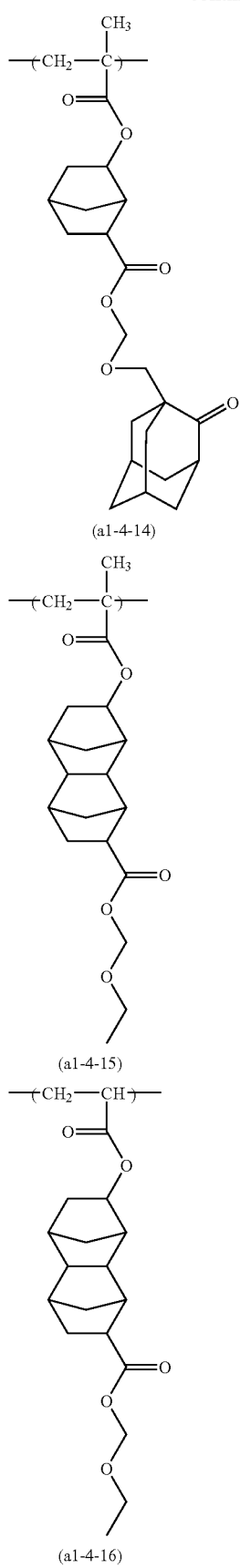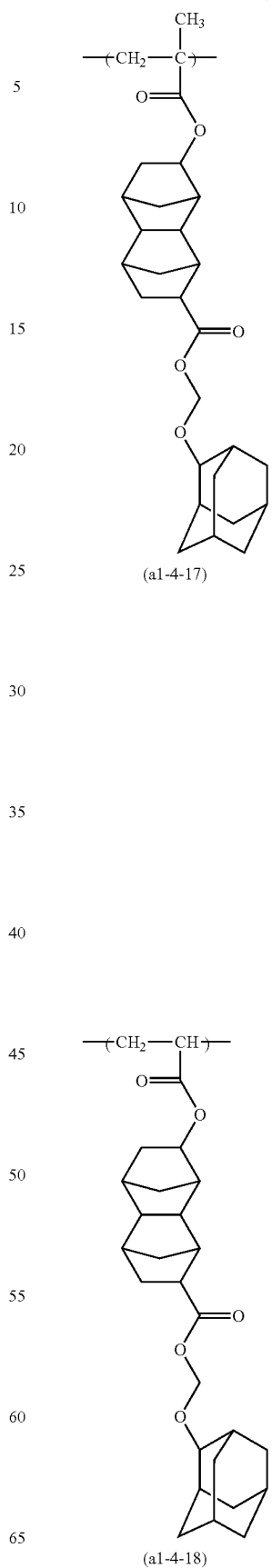
[Chemical Formula 31]

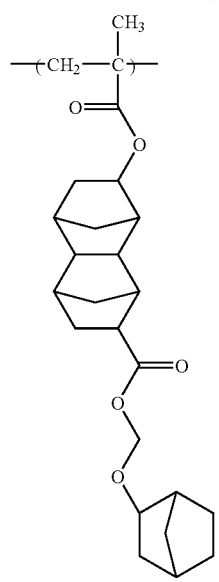
(a1-4-19)
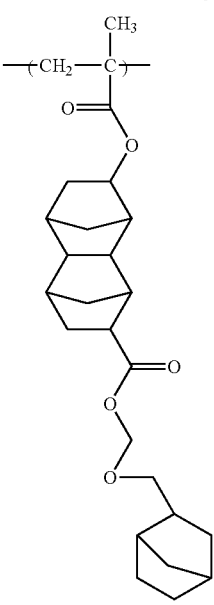
(a1-4-21)
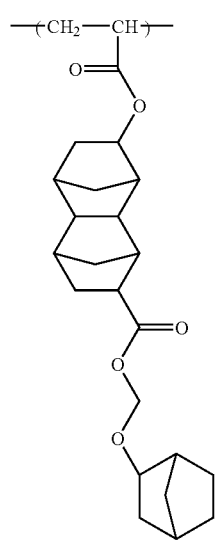
(a1-4-20)
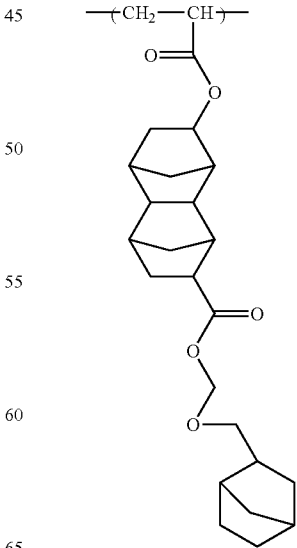
(a1-4-22)

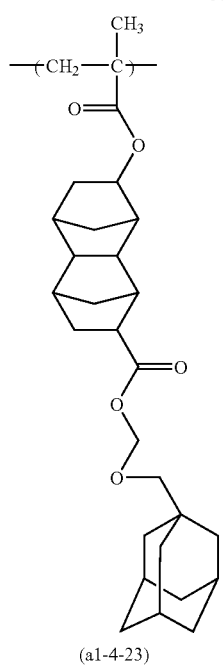
(a1-4-23)
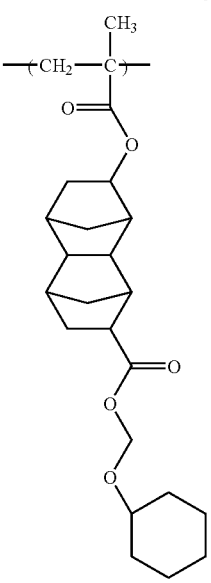
(a1-4-25)
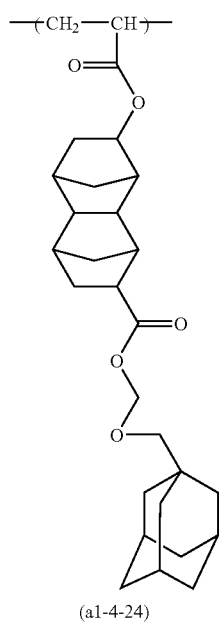
(a1-4-24)
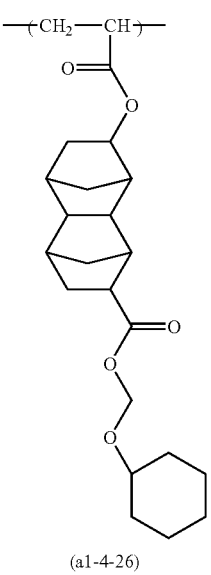
(a1-4-26)

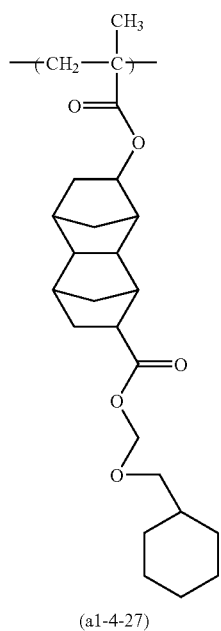

(a1-4-27)

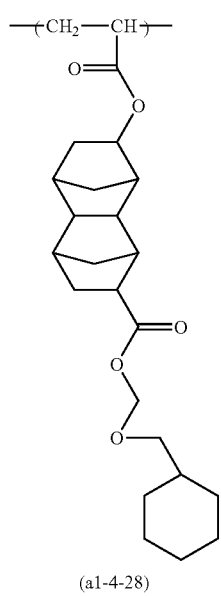

(a1-4-28)

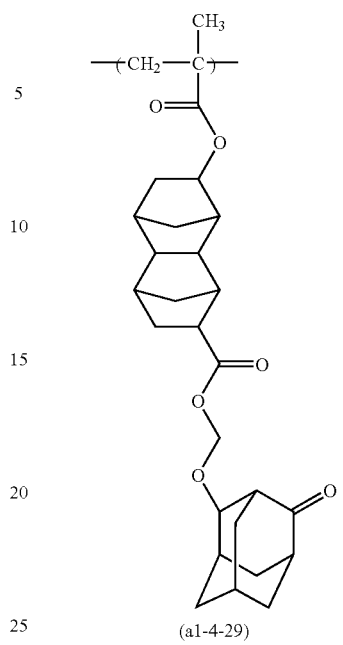

(a1-4-29)

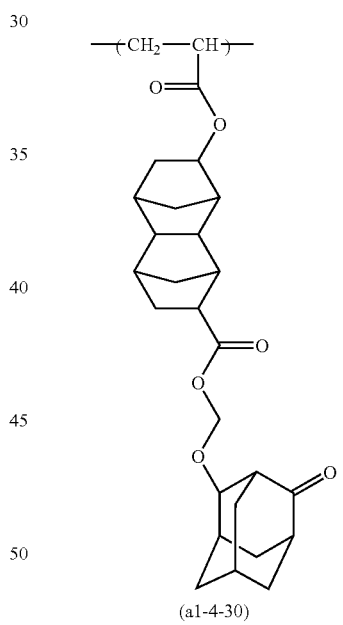

(a1-4-30)

Among the above units, structural units represented by general formula (a1-1) are preferable. More specifically, at least one structural unit selected from the group consisting of structural units represented by formulas (a1-1-1) to (a1-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-1-35) to (a1-1-41) are also preferable.

[Chemical Formula 32]

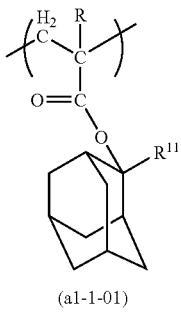

(a1-1-01)

[wherein, R represents a hydrogen atom, a lower alkyl group or a halogenated lower alkyl group; and $R^{11}$ represents a lower alkyl group.]

[Chemical Formula 33]

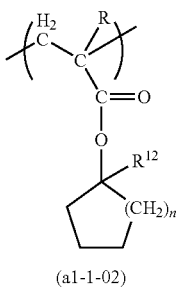

(a1-1-02)

[wherein, R represents a hydrogen atom, a lower alkyl group or a halogenated lower alkyl group; $R^{12}$ represents a lower alkyl group; and h represents an integer of 1 to 3.]

In general formula (a1-1-01), R is as defined for R in general formula (a1-0-1) shown above.

The lower alkyl group for $R^{11}$ is as defined for the lower alkyl group for R in general formula (a1-0-1) shown above, and is preferably a methyl group or an ethyl group.

In general formula (a1-1-02), R is as defined for R in general formula (a1-0-1) shown above.

The lower alkyl group for $R^{12}$ is as defined for the lower alkyl group for R in general formula (a1-0-1) shown above, is preferably a methyl group or an ethyl group, and is most preferably an ethyl group, h is preferably 1 or 2, and most preferably 2.

As the structural unit (a1), a single type of structural unit may be used, or a combination of two or more types may be used.

In the component (A1), the amount of the structural unit (a1) based on the combined total of all structural units constituting the component (A1) is preferably 10 to 80 mol %, more preferably 20 to 70 mol %, and still more preferably 25 to 50 mol %. By making the amount of the structural unit (a1) at least as large as the lower limit of the above-mentioned range, a pattern can be easily formed using a resist composition prepared from the component (A1). On the other hand, by making the amount of the structural unit (a1) no more than the upper limit of the above-mentioned range, a good balance can be achieved with the other structural units.

—Structural Unit (a2):

The structural unit (a2) is derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring, A lactone-containing cyclic group in which the only ring structure is the lactone ring is referred to as a monocyclic group, and groups containing other ring structures are described as polycyclic groups regardless of the structure of the other rings.

When the copolymer (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 34]

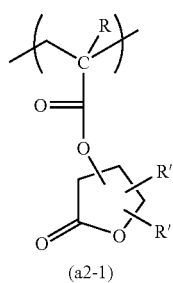

(a2-1)

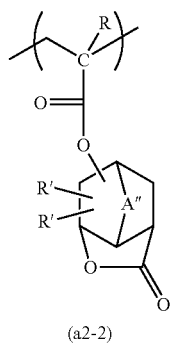

(a2-2)

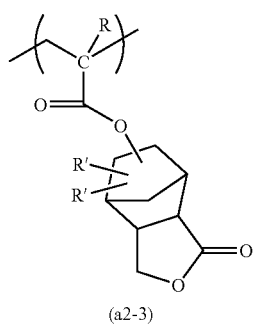

(a2-3)

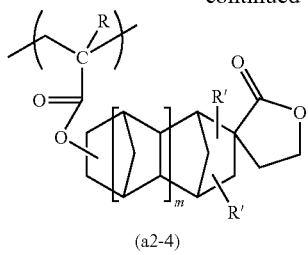

(a2-4)

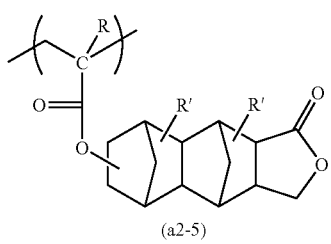

(a2-5)

[wherein R represents a hydrogen atom, a lower alkyl group or a halogenated lower alkyl group; R' represents a hydrogen atom, a lower alkyl group, an alkoxy group of 1 to 5 carbon atoms, or a —COOR" group; R" represents a hydrogen atom, or a linear, branched or cyclic alkyl group of 1 to 15 carbon atoms; m represents an integer of 0 or 1; and A" represents an alkylene group of 1 to 5 carbon atoms that may include an oxygen atom or sulfur atom, an oxygen atom, or a sulfur atom.]

In general formulas (a2-1) to (a2-5), R is as defined for R in general formula (a1-0-1) shown above.

The lower alkyl group for R' is as defined for the lower alkyl group for R in general formula (a1-0-1) shown above.

When R" represents a linear or branched alkyl group, the group preferably contains 1 to 10 carbon atoms, and more preferably 1 to 5 carbon atoms.

When R" represents a cyclic alkyl group, the group preferably contains 3 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, or a polycycloalkane such as adamantane, norbornane, isobornane, tricyclodecane or tetracyclododecane.

In general formulas (a2-1) to (a2-5), in consideration of industrial availability, R' is preferably a hydrogen atom.

Specific examples of the alkylene group of 1 to 5 carbon atoms that may include an oxygen atom or sulfur atom include a methylene group, ethylene group, n-propylene group, isopropylene group, —O—CH$_2$—, —CH$_2$—O—CH$_2$—, —S—CH$_2$—, and —CH$_2$—S—CH$_2$—.

Specific examples of structural units represented by general formulas (a2-1) to (a2-5) are shown below.

[Chemical Formula 35]

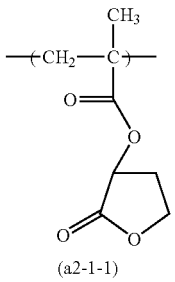

(a2-1-1)

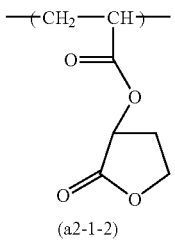

(a2-1-2)

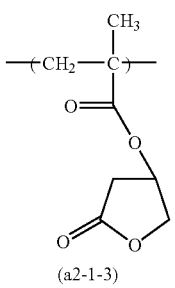

(a2-1-3)

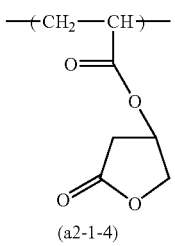

(a2-1-4)

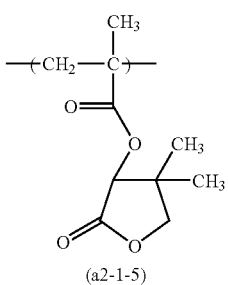

(a2-1-5)

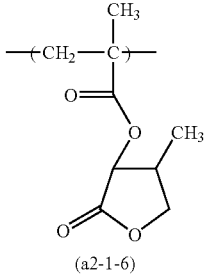

(a2-1-6)

[Chemical Formula 36]
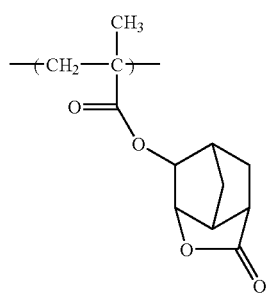
(a2-2-1)
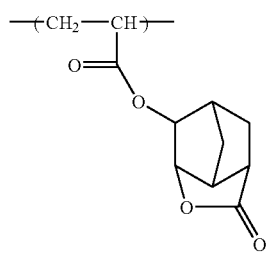
(a2-2-2)
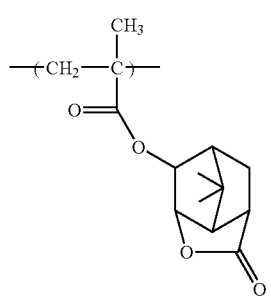
(a2-2-3)
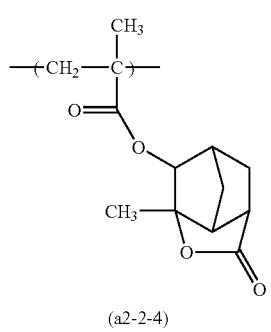
(a2-2-4)
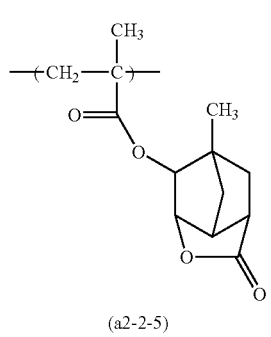
(a2-2-5)
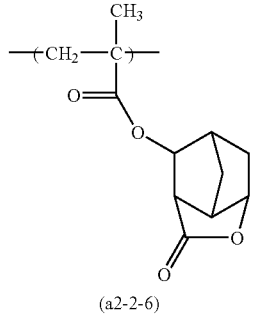
(a2-2-6)
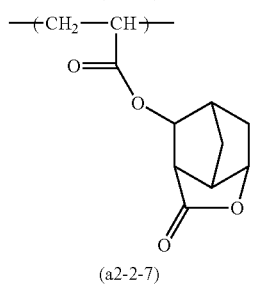
(a2-2-7)
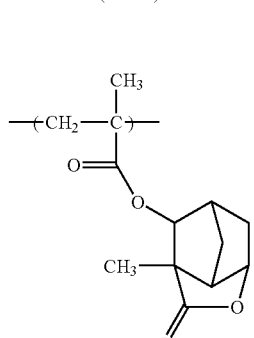
(a2-2-8)
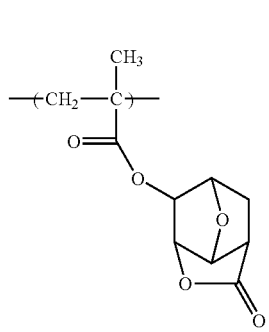
(a2-2-9)
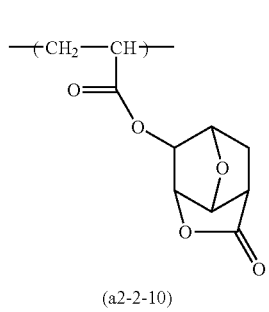
(a2-2-10)

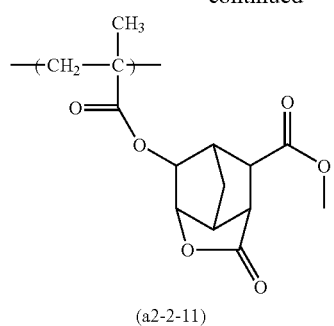
(a2-2-11)
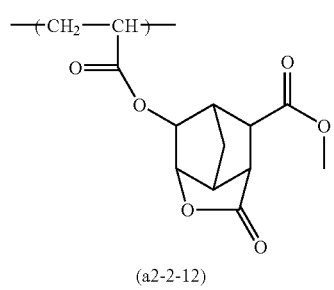
(a2-2-12)
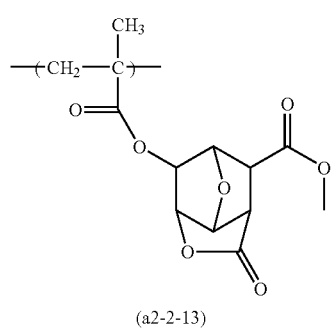
(a2-2-13)
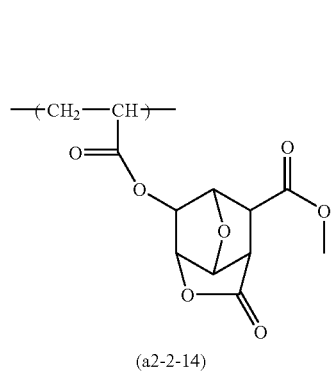
(a2-2-14)
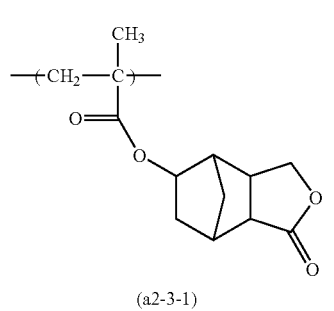
(a2-3-1)
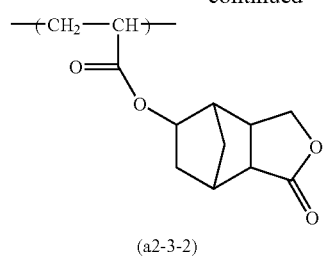
(a2-3-2)
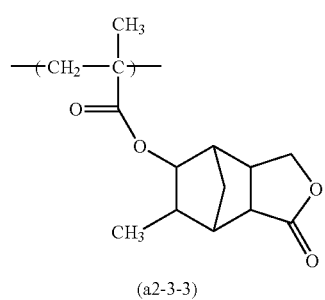
(a2-3-3)
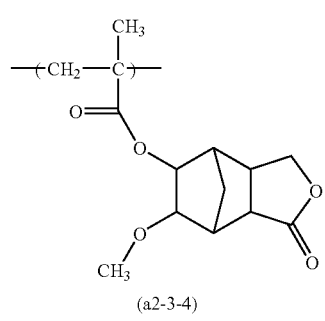
(a2-3-4)
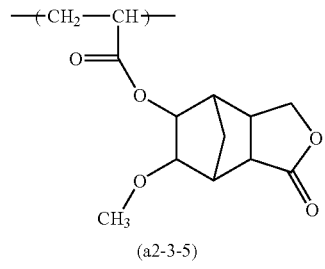
(a2-3-5)
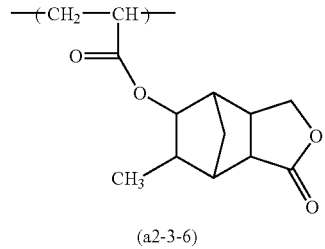
(a2-3-6)
[Chemical Formula 37]
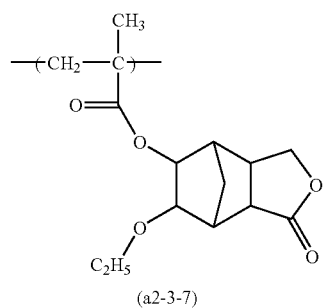
(a2-3-7)

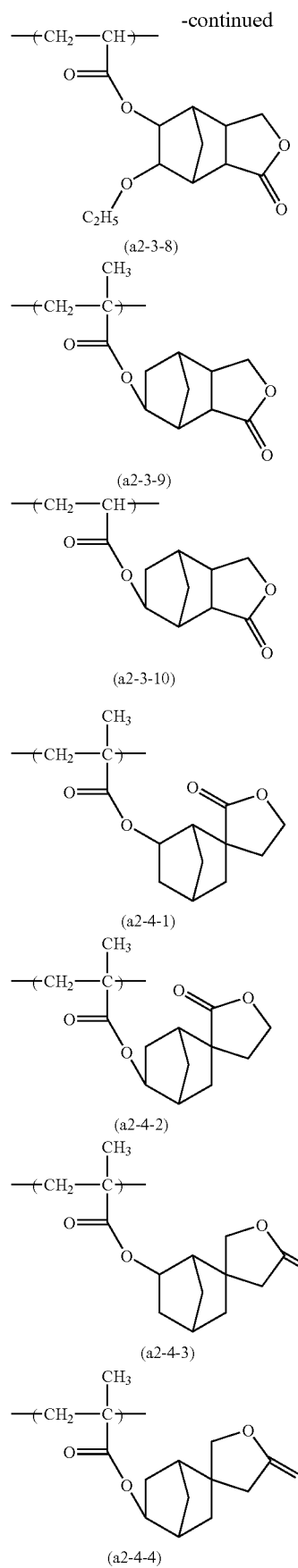

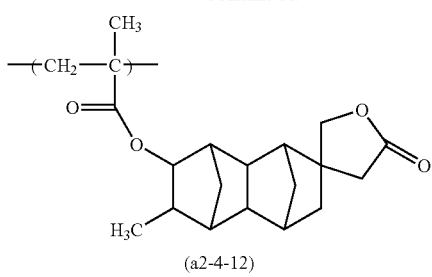

(a2-4-12)

[Chemical Formula 39]

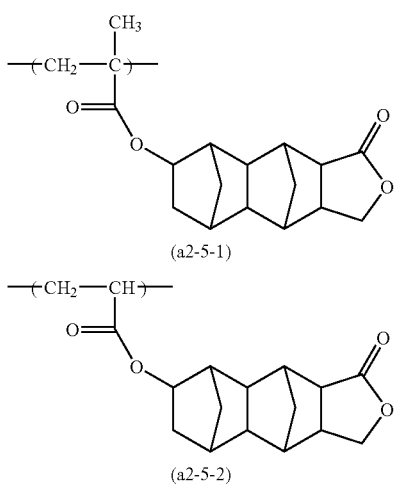

(a2-5-1)

(a2-5-2)

(a2-5-3)

(a2-5-4)

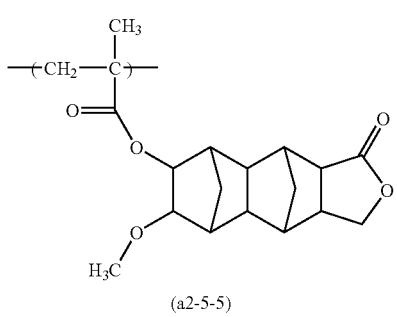

(a2-5-5)

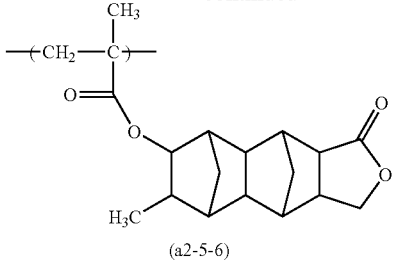

(a2-5-6)

In the component (A1), as the structural unit (a2), one type of structural unit may be used, or two or more types may be used in combination.

Of these, at least one structural unit selected from the group consisting of structural units represented by formulas (a2-1) to (a2-5) is preferable, and at least one structural unit selected from the group consisting of structural units represented by formulas (a2-1) to (a2-3) is more preferable. Specifically, it is preferable to use at least one structural unit selected from the group consisting of structural units represented by formulas (a2-1-1), (a2-1-2), (a2-2-1), (a2-2-2), (a2-2-9), (a2-2-10), (a2-3-1), (a2-3-2), (a2-3-9) and (a2-3-10).

As the structural unit (a2), one type of structural unit may be used, or two or more types may be used in combination.

In the component (A1), the amount of the structural unit (a2) based on the combined total of all structural units constituting the component (A1) is preferably 5 to 60 mol %, more preferably 10 to 50 mol %, and still more preferably 20 to 50 mol % By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

—Structural Unit (a3):

The structural unit (a3) is derived from an acrylate ester having a polar group-containing aliphatic hydrocarbon group By including the structural unit (a3) within the component (A1), the hydrophilicity of the component (A1) is improved, and hence, the compatibility of the component (A1) with the developing solution is improved. As a result, the solubility of the exposed portions in an alkali developing solution improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that includes an aliphatic polycyclic group containing a hydroxyl group, cyano group, carboxyl group or a hydroxyalkyl group in which some of the hydrogen atoms of the alkyl group have been substituted with fluorine atoms are particularly desirable. Examples of the polycyclic group include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 40]

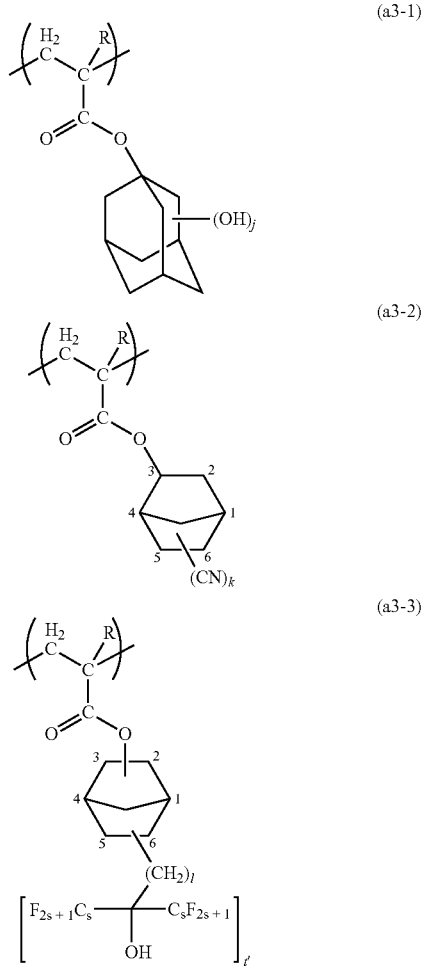

[wherein, R is as defined above; j is an integer of 1 to 3; k is an integer of 1 to 3; t' is an integer of 1 to 3; l is an integer of 1 to 5; and s is an integer of 1 to 3.]

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1, l is preferably 1, and s is preferably 1. Further, in formula (a3-3), it is preferable that a 2-norbornyl group or 3-norbornyl group be bonded to the terminal of the carboxyl group of the acrylic acid. The fluorinated alkyl alcohol is preferably bonded to the 5th or 6th position of the norbornyl group.

As the structural unit (a3), one type of structural unit may be used, or two or more types may be used in combination.

The amount of the structural unit (a3) within the component (A1) based on the combined total of all structural units constituting the component (A1) is preferably 5 to 50 mol %, more preferably 5 to 40 mol %, and still more preferably 5 to 25 mol %. By making the amount of the structural unit (a3) at least as large as the lower limit of the above-mentioned range, the effect of using the structural unit (a3) can be satisfactorily achieved. On the other hands by making the amount of the structural unit (a3) no more than the upper limit of the above-mentioned range, a good balance can be achieved with the other structural units.

—Structural Unit (a4):

The component (A1) may also include a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 41]

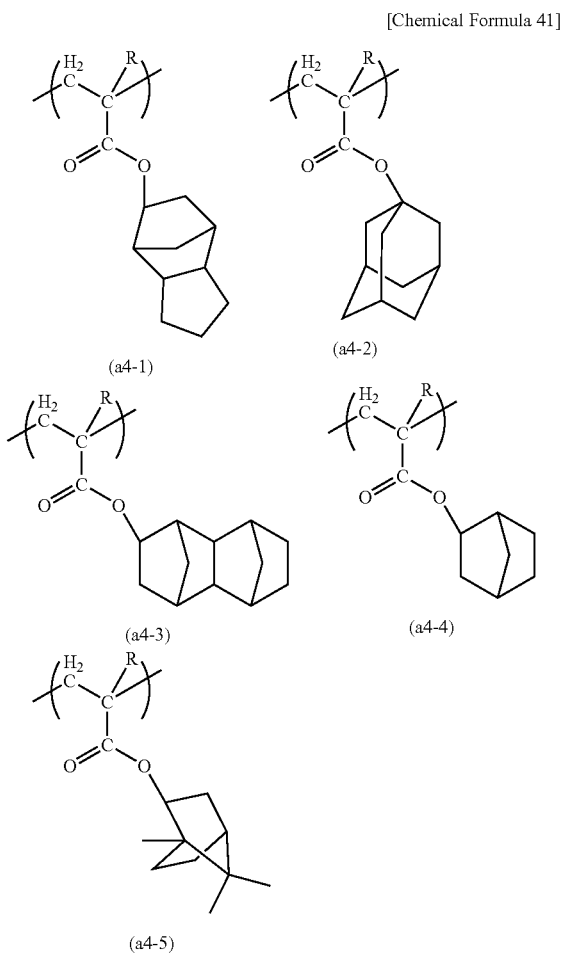

(wherein, R is as defined above.)

When the structural unit (a4) is included in the component (A1), the amount of the structural unit (a4) within the component (A1) based on the combined total of all the structural units that constitute the component (A1) is preferably within a range from 1 to 30 mol %, and more preferably from 10 to 20 mol %.

In the present invention, the component (A1) preferably includes a copolymer having the structural units (a1), (a2) and (a3). Examples of such a copolymer include a copolymer consisting of the structural units (a1) and (a2) and (a3), and a copolymer consisting of the structural units (a1), (a2), (a3) and (a4).

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—CH$_2$—CH$_2$—CH$_2$—C(CF$_3$)$_2$—OH during the above polymerization, a —C(CF$_3$)$_2$—OH group can be introduced at the terminals of the component (A1). Such a copolymer having an introduced hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. By making the weight average molecular weight no more than the upper limit of the above-mentioned range, the component (A1) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

[Component (A2)]

As the component (A2), a low molecular weight compound that has a molecular weight of at least 500 but less than 2,000, contains a hydrophilic group, and also contains an acid dissociable, dissolution inhibiting group such as the groups exemplified above in the description of the component (A1) is preferred. Specific examples include compounds containing a plurality of phenol structures, in which some of the hydroxyl group hydrogen atoms have been substituted with the acid dissociable, dissolution inhibiting groups exemplified above in the description of the component (A1).

Preferred examples of the component (A2) include low molecular weight phenol compounds that are known, for example, as sensitizers or heat resistance improvers for use in non-chemically amplified g-line or i-line resists, wherein some of the hydroxyl group hydrogen atoms of these compounds have been substituted with the types of acid dissociable, dissolution inhibiting groups exemplified above in the description of the component (A1), and any of these compounds may be used.

Specific examples of the low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Of course, this is not a restrictive list.

There are no particular limitations on the acid dissociable, dissolution inhibiting group, and examples include the groups exemplified above.

As the component (A), one type of component may be used alone, or two or more types may be used in combination.

In the resist composition of the present invention, the amount of the component (A) can be appropriately adjusted depending on the thickness of the resist film to be formed.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As the onium salt-based acid generator, a compound represented by general formula (b-1) or (b-2) shown below can be used.

[Chemical Formula 42]

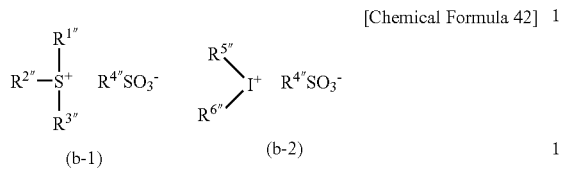

[wherein, $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom in the formula; and $R^{4''}$ represents a linear, branched or cyclic alkyl group or fluorinated alkyl group; provided that at least one of $R^{1''}$ to $R^{3''}$ represents an aryl group, and at least one of $R^{5''}$ and $R^{6''}$ represents an aryl group.]

In formula (b-1), $R^{1''}$ to $R^{3''}$ each independently represents an aryl group or an alkyl group. Two of $R^{1''}$ to $R^{3''}$ in formula (b-1) may be bonded to each other to form a ring with the sulfur atom in the formula.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used, in which some or all of the hydrogen atoms of the aryl group may or may not be substituted with alkyl groups, alkoxy groups, halogen atoms or hydroxyl groups. The aryl group is preferably an aryl group having 6 to 10 carbon atoms because it can be synthesized at a low cost. Specific examples thereof include a phenyl group and a naphthyl group.

The alkyl group with which hydrogen atoms of the aryl group may be substituted is preferably an alkyl group having 1 to 5 carbon atoms, and most preferably a methyl group, ethyl group, propyl group, n-butyl group or tert-butyl group.

The alkoxy group with which hydrogen atoms of the aryl group may be substituted is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

The halogen atom with which hydrogen atoms of the aryl group may be substituted is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group or decanyl group. A methyl group is most preferable because it is excellent in resolution and can be synthesized at a low cost.

It is particularly desirable that each of $R^{1''}$ to $R^{3''}$ is a phenyl group or a naphthyl group.

When two of $R^{1''}$ to $R^{3''}$ in formula (b-1) are bonded to each other to form a ring with the sulfur atom shown in the formula, it is preferable that the two of $R^{1''}$ to $R^{3''}$ form a 3- to 10-membered ring including the sulfur atom, and it is particularly desirable that the two of $R^{1''}$ to $R^{3''}$ form a 5- to 7-membered ring including the sulfur atom.

When two of $R^{1''}$ to $R^{3''}$ in formula (b-1) are bonded to each other to form a ring with the sulfur atom shown in the formula, the remaining one of $R^{1''}$ to $R^{3''}$ is preferably an aryl group. As examples of the aryl group, the same as the above-mentioned aryl groups for $R^{1''}$ to $R^{3''}$ can be exemplified.

$R^{4''}$ represents a linear, branched or cyclic alkyl group or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group as described for $R^{1''}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (the percentage of fluorine atoms within the alkyl group) is preferably from 10 to 100%, more preferably from 50 to 100%, and it is particularly desirable that all hydrogen atoms are substituted with fluorine atoms (namely, the fluorinated alkyl group is a perfluoroalkyl group) because the acid strength increases.

$R^{4''}$ is most preferably a linear or cyclic alkyl group or fluorinated alkyl group.

In formula (b-2), $R^{5''}$ and $R^{6''}$ each independently represents an aryl group or an alkyl group. At least one of $R^{5''}$ and $R^{6''}$ represents an aryl group. It is preferable that $R^{5''}$ and $R^{6''}$ both represent aryl groups.

As the aryl group for $R^{5''}$ and $R^{6''}$, the same aryl groups as those mentioned above for $R^{1''}$ to $R^{3''}$ in formula (b-1) can be exemplified.

As the alkyl group for $R^{5''}$ and $R^{6''}$, the same alkyl groups as those mentioned above for $R^{1''}$ to $R^{3''}$ in formula (b-1) can be exemplified.

It is particularly desirable that both of $R^{5''}$ and $R^{6''}$ represent phenyl groups.

As $R^{4''}$ in formula (b-2), the same groups as those mentioned above for $R^{4''}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)

phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalen-1-yl)tetrahydrothiophenium trifluoromethanesulfonate, heptafluoropropanesulfonate or nonafluorobutanesulfonate; 1-(4-ethoxynaphthalen-1-yl)tetrahydrothiophenium trifluoromethanesulfonate, heptafluoropropanesulfonate or nonafluorobutanesulfonate; 1-(4-n-butoxynaphthalen-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has been replaced by mefliane-sulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may also be used.

[Chemical Formula 43]

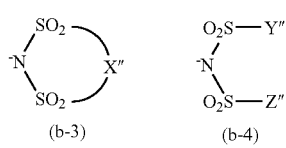

(b-3)  (b-4)

[wherein, X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.]

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms within the alkylene group of X" or within the alkyl group of Y" and Z" within the above ranges for the number of carbon atoms, the better the solubility in a resist solvent.

Further, in the alkylene group of X" or the alkyl group of Y" and Z", it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all the hydrogen atoms are substituted with fluorine atoms.

Furthermore, as the onium salt-based acid generator, a sulfonium salt having a cation moiety represented by general formula (b-5) or (b-6) shown below may also be used.

[Chemical Formula 44]

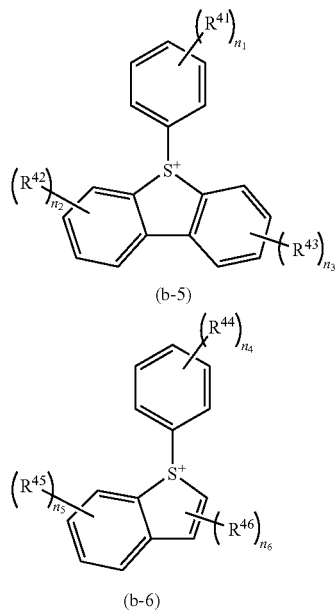

(b-5)

(b-6)

[wherein $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and $n_6$ represents an integer of 0 to 2.]

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have been substituted with hydroxy groups, and examples thereof include a hydroxymethyl group, hydroxyethyl group and hydroxypropyl group.

When the subscripts $n_1$ to $n_6$ of $R^{41}$ to $R^{46}$ represent an integer of 2 or more, the plurality of $R^{41}$ to $R^{46}$ may be the same or different.

$n_1$ is preferably 0 to 2, more preferably 0 or 1, and still more preferably 0.

It is preferable that $n_2$ and $n_3$ each independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties as those used within previously proposed onium salt-based acid generators may be used. Examples of such anion moieties include fluorinated alkylsulfonate ions such as anion moieties ($R^{4"}SO_3^-$) for onium salt-based acid generators represented by general formula (b-1) or (b-2) shown above; and anion moieties represented by general formula (b-3) or (b-4) shown above. Among these, fluorinated alkylsulfonate ions are preferable, more preferably fluorinated alkylsulfonate ions of 1 to 4 carbon atoms, and linear perfluoroalkylsulfonate ions of 1 to 4 carbon atoms are particularly desirable. Specific examples include a trifluoromethylsulfonate ion, heptafluoro-n-propylsulfonate ion and nonafluoro-n-butylsulfonate ion.

In the present description, an oxime sulfonate-based acid generator is a compound having at least one group represented by general formula (B-1) shown below, and has a feature of generating acid by irradiation. Such oxime sulfonate-based acid generators are widely used for a chemically amplified resist composition, and can be selected as appropriate.

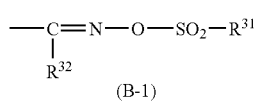

[Chemical Formula 45]

(B-1)

[wherein $R^{31}$ and $R^{32}$ each independently represents an organic group.]

The organic group for $R^{31}$ and $R^{32}$ refers to a group containing a carbon atom, and may include atoms other than carbon atoms (such as a hydrogen atom, an oxygen atom, a nitrogen atom, a sulfur atom, or a halogen atom (such as a fluorine atom and a chlorine atom) and the like).

As the organic group for $R^{31}$, a linear, branched, or cyclic alkyl group or an aryl group is preferable. The alkyl group or the aryl group may have a substituent. The substituent is not particularly limited, and examples thereof include a fluorine atom and a linear, branched or cyclic alkyl group having 1 to 6 carbon atoms. The expression "have a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate-based acid generator include compounds represented by general formula (B-2) or (B-3) shown below.

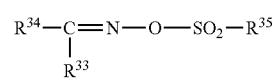

[Chemical Formula 46]

(B-2)

[wherein, $R^{33}$ represents a cyano group, an alkyl group having no substituent, or a halogenated alkyl group; $R^{34}$ represents an aryl group; and $R^{35}$ represents an alkyl group having no substituent, or a halogenated alkyl group.]

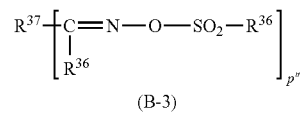

[Chemical Formula 47]

(B-3)

[wherein $R^{36}$ represents a cyano group, an alkyl group having no substituent, or a halogenated alkyl group; $R^{37}$ represents a divalent or trivalent aromatic hydrocarbon group; $R^{38}$ represents an alkyl group having no substituent, or a halogenated alkyl group; and p" represents 2 or 3.]

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group and a phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for R$^{35}$
preferably has 1 to 10 carbon atoms, more preferably 1 to 8 carbon atoms, and most preferably 1 to 6 carbon atoms.

As R$^{35}$, a halogenated alkyl group is preferable, and a fluorinated alkyl group is more preferable.

In terms of enhancing the strength of the acid generated, the fluorinated alkyl group for R$^{35}$ preferably has 50% or more of the hydrogen atoms fluorinated, more preferably 70% or mores still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for R$^{36}$ are the same as the alkyl group having no substituent and the halogenated alkyl group for R$^{33}$ in general formula (B-2).

Examples of the divalent or trivalent aromatic hydrocarbon group for R$^{37}$ include groups in which one or two hydrogen atoms have been removed from the aryl group for R$^{34}$ in general formula (B-2).

As the alkyl group having no substituent or the halogenated alkyl group for R$^{38}$, the same alkyl groups having no substituent or the halogenated alkyl groups exemplified above for R$^{35}$ in general formula (B-2) can be used.

p″ is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromemylsulfonyloxyimino)-1-cyclopentenyl acetonitrile, α-(trifluoromethylsulfonyloxyiniino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(emylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No, Hei 9-208554 (Chemical Formulas 18 and 19 shown in paragraphs [0012] to [0014]) and oxime sulfonate-based acid generators disclosed in WO 2004/074242A2 (Examples 1 to 40 described on pages 65 to 85) may be favorably used.

Furthermore, as preferred examples, the following can be exemplified,

[Chemical Formula 48]

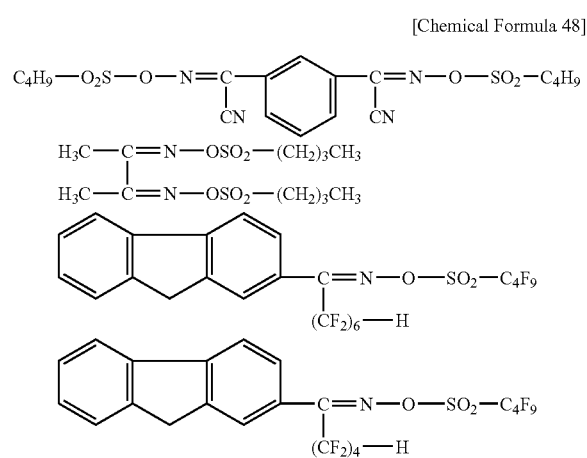

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of acid generator may be used, or two or more types may be used in combination.

In the present invention, as the component (B), it is preferable to use an onium salt-based acid generator having a fluorinated alkylsulfonic acid ion that may have a substituent as the anion moiety.

The amount of the component (B) within the resist composition for immersion exposure according to the present invention is preferably from 0.5 to 30 parts by weight, and more preferably from 1 to 10 parts by weight, relative to 100 parts by weight of the component (A). When the amount of the component (B) is within the above-mentioned range, formation of a resist pattern can be satisfactorily performed.

Further, by virtue of the above-mentioned range, a uniform solution can be obtained and the storage stability becomes satisfactory.

<Component (C)>

The component (C) is the fluorine-containing compound (C) of the present invention described above.

As the component (C), one type of fluorine-containing compound may be used, or two or more types may be used in combination.

The amount of the component (C) within the resist composition for immersion exposure according to the present invention is preferably from 0.1 to 20 parts by weight, more preferably from 0.5 to 15 parts by weight, still more preferably from 0.5 to 10 parts by weight, and most preferably from 1 to 5 parts by weight, relative to 100 parts by weight of the component (A). By making the amount of the component (C) at least as large as the lower limit of the above-mentioned range, the hydrophobicity of the resist film formed using the resist composition for immersion exposure improves, yielding a level of hydrophobicity that is ideal for immersion exposure. On the other hand, by making the amount of the component (C) no more than the upper limit of the above-mentioned range, the lithography properties are improved.

<Optional Components>

In order to improve factors such as the resist pattern shape and the post exposure stability of the latent image formed by the pattern-wise exposure of the resist layer, it is preferable that the resist composition for immersion exposure according to the present invention further includes a nitrogen-containing organic compound (D) (hereafter referred to as "component (D)") as an optional component.

A multitude of these components (D) have already been proposed, and any of these known compounds may be used, although an aliphatic amine, and particularly a secondary aliphatic amine or tertiary aliphatic amine is preferable. An "aliphatic amine" is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (that is, alkylamines or alkyl alcohol amines), and cyclic amines.

Specific examples of the alkylamines or alkyl alcohol amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine is particularly desirable.

Examples of the cyclic amines include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Either one type of amine may be used, or two or more types may be used in combination.

The component (D) is typically used in an amount within a range from 0.01 to 5.0 parts by weight, relative to 100 parts by weight of the component (A).

Furthermore, in the resist composition for immersion exposure according to the present invention, for preventing any deterioration in sensitivity, and improving the resist pattern shape and the post exposure stability of the latent image formed by the pattern-wise exposure of the resist layer, at least one compound (E) (hereafter referred to as "component (E)") selected from the group consisting of organic carboxylic acids, and phosphorus oxo acids and derivatives thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid, and among these, phosphonic acid is particularly desirable.

Examples of oxo acid derivatives include esters in which a hydrogen atom within an above-mentioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type of component may be used alone, or two or more types may be used in combination.

The component (E) is typically used in an amount within a range from 0.01 to 5.0 parts by weight, relative to 100 parts by weight of the component (A).

If desired, other miscible additives can also be added to the resist composition for immersion exposure according to the present invention. Examples of such miscible additives include additive resins for improving the performance of the resist film, surfactants for improving the applicability, dissolution inhibitors, plasticizers, stabilizers, colorants, halation prevention agents, and dyes.

<Organic Solvent (S)>

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PG-MEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These solvents can be used individually, or as a mixed solvent containing two or more different solvents.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is adjusted appropriately to a concentration that enables application of a coating solution to a substrate in accordance with the thickness of the coating film. In general, the organic solvent is used in an amount that yields a solid content for the resist composition that is within a range from 2 to 20% by weight, and preferably from 5 to 15% by weight.

Dissolving of the materials for a resist composition in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh, or a membrane filter or the like.

The resist composition for immersion exposure according to the present invention has the properties required of a resist composition used in immersion lithography, namely, favorable lithography properties and favorable properties (particularly hydrophobicity) for use within an immersion exposure process, and can therefore be used very favorably for immersion exposure.

A resist film formed using the resist composition for immersion exposure according to the present invention contains the component (C) described above (namely, the fluorine-containing compound (C) of the present invention).

This component (C) has a high hydrophobicity by virtue of containing a fluorine atom, and also exhibits a property wherein the hydrophilicity increases under basic conditions by virtue of containing a $-O-R^2$ group. This increase in hydrophilicity is because under the action of a base (an alkali developing solution), the $-R^2$ group dissociates, forming a hydrophilic (—OH) group.

Accordingly, a resist film formed using a resist composition for immersion exposure of the present invention that includes the component (C) together with the component (A) and the component (B) exhibits a high level of hydrophobicity prior to contact with an alkali developing solution (for example, during the immersion exposure), but then develops increased hydrophilicity upon contact with the alkali developing solution.

In this manner, because the hydrophobicity is high during the immersion exposure, a resist film formed using the resist composition for immersion exposure according to the present invention exhibits an extremely favorable water tracking ability, which is required when the immersion exposure is performed using a scanning-type immersion exposure apparatus such as that disclosed in Non-Patent Document 1.

Further, because the hydrophilicity is increased during alkali developing, the resist composition for immersion exposure according to the present invention can effectively reduce defects during the immersion exposure, In other words, when immersion exposure of a resist film is conducted during immersion lithography, the solubility of the exposed portions within an alkali developing solution changes. For example, in the case of a positive resist composition, the solubility of the exposed portions in an alkali developing solution increases, whereas in the case of a negative resist composition, the solubility of the exposed portions in an alkali developing solution decreases. Then, when alkali developing is conducted, the exposed portions are removed in the case of the positive composition, and the unexposed portions are removed in the case of the negative composition, in either case leading to the formation of a resist pattern.

During this process, the surface of those portions of the resist film that are not irradiated during the immersion exposure (for example, the unexposed portions of a positive resist) are prone to developing defects caused by the immersion medium such as water (such as water mark defects) following developing. However, because a resist film formed using the resist composition for immersion exposure according to the present invention exhibits increased hydrophilicity during developing, it is able to reduce the occurrence of these defects.

Further, by using the resist composition for immersion exposure according to the present invention, substance elution from the resist film during immersion exposure can be suppressed.

As described above, immersion exposure is a technique that includes a step of conducting exposure (immersion exposure) in a state where the region between the lens and the resist film formed on the wafer, which has conventionally been filled with air or an inert gas such as nitrogen, is filled with a solvent (a liquid immersion medium) having a larger refractive index than the refractive index of air. In immersion exposure, when the resist film and the immersion solvent make contact, elution of substances within the resist film (such as the component (B) and the component (D)) into the immersion solvent (namely, substance elution) tends to occur. This substance elution causes phenomena such as degeneration of the resist layer and variation in the refractive index of the immersion solvent, causing a deterioration in the lithography properties.

The amount of this substance elution is affected by the properties of the resist film surface (such as the hydrophilicity or hydrophobicity). Accordingly, it is thought that by increasing the hydrophobicity of the resist film surface, the degree of substance elution can be reduced.

A resist film formed using the resist composition for immersion exposure according to the present invention includes the fluorine atom-containing component (C), and therefore has a higher level of hydrophobicity prior to exposure and developing than a resist film that does not include the component (C). Accordingly, the resist composition for immersion exposure according to the present invention can inhibit substance elution during immersion exposure.

Because it enables suppression of substance elution, using the resist composition for immersion exposure of the present invention also enables suppression of degeneration of the resist film and variation in the refractive index of the immersion solvent during immersion exposure. By suppressing fluctuation in the refractive index of the immersion solvent, the shape and the like of the resulting resist pattern can be improved. Further, staining of the lens of the exposure apparatus can also be reduced. As a result, protective measures for preventing such staining need not be performed, which contributes to a simplification of both the process and the exposure apparatus.

Further, a resist film formed using the resist composition for immersion exposure according to the present invention is resistant to swelling water, meaning a very fine resist pattern can be formed with superior precision.

Furthermore, the resist composition for immersion exposure according to the present invention also exhibits favorable lithography properties such as sensitivity, resolution and etching resistance, and when used as a resist in an actual immersion exposure, is capable of forming a favorable resist pattern without any practical difficulties. For example, by using the resist composition for immersion exposure according to the present invention, a very fine resist pattern with dimensions of not more than 120 nm can be formed.

The hydrophobicity of a resist film can be evaluated by measuring the contact angles relative to water, such as the static contact angle (the contact angle between the surface of a water droplet on the resist film in a horizontal state and the resist film surface), and the dynamic contact angles (including the contact angle at which a water droplet starts to slide when the resist film is inclined (the sliding angle), the contact angle at the front-end point of the water droplet in the sliding direction (the advancing angle), and the contact angle at the rear-end point of the water droplet in the sliding direction (the receding angle)). For example, the higher the hydrophobicity of the resist film, the larger the static contact angle, the advancing angle and the receding angle, and the smaller the sliding angle.

As shown in FIG. 1, when a flat surface 2 with a liquid droplet 1 placed thereon is gradually inclined, the advancing angle describes the angle $\theta_1$ between the surface of the liquid droplet at the bottom edge 1a of the liquid droplet 1 and the flat surface 2 when the liquid droplet 1 starts to move (slide) down the flat surface 2. Further, at this point (the point when the liquid droplet 1 starts to move (slide) down the flat surface 2), the angle $\theta_2$ between the surface of the liquid droplet at the top edge 1b of the liquid droplet 1 and the flat surface 2 is the receding angle, and the inclination angle $\theta_3$ of the flat surface 2 is the sliding angle.

In the present description, the advancing angle, the receding angle, and the sliding angle are measured in the following manner.

First, a resist composition solution is spin-coated onto a silicon substrate, and is then heated at a temperature of 110° C. for 60 seconds to form a resist film.

Subsequently, the contact angles for the resist film can be measured using a commercially available measurement apparatus such as a DROP MASTER-700 (product name, manufactured by Kyowa Interface Science Co. Ltd.), AUTO SLIDING ANGLE: SA-30DM (product name, manufactured by Kyowa Interface Science Co. Ltd.), or AUTO DISPENSER: AD-31 (product name, manufactured by Kyowa Interface Science Co. Ltd.).

For a resist film obtained using the resist composition for immersion exposure according to the present invention, the receding angle measured prior to immersion exposure and developing is preferably 50 degrees or more, more preferably from 50 to 150 degrees, still more preferably from 50 to 130 degrees, and most preferably from 53 to 100 degrees. When the receding angle is at least as large as the lower limit of the above-mentioned range, the suppression effect on substance elution during the immersion exposure is enhanced. The reason for this has not been elucidated yet, but it is presumed that one of the main reasons is related to the hydrophobicity of the resist film. More specifically, it is presumed that since an aqueous substance such as water is used as the immersion medium, higher hydrophobicity has an influence on the swift removal of the immersion medium from the surface of the resist film after the immersion exposure. On the other hand, when the receding angle is no higher than the upper limit of the above-mentioned range, the lithography properties become satisfactory.

For similar reasons, for a resist film obtained using the resist composition for immersion exposure according to the present invention, the static contact angle measured prior to immersion exposure and developing is preferably 60 degrees or more, more preferably from 63 to 95 degrees, and most preferably from 65 to 95 degrees.

Furthermore, for a resist film obtained using the resist composition for immersion exposure according to the present invention, the sliding angle measured prior to immersion exposure and developing is preferably no more than 36 degrees, more preferably from 10 to 36 degrees, still more preferably from 7 to 30 degrees, and most preferably from 14 to 27 degrees. When the sliding angle is no higher than the upper limit of the above-mentioned range, the suppression effect on substance elution during the immersion exposure is enhanced. In contrast, when the sliding angle is at least as large as the lower limit of the above-mentioned range, the lithography properties become satisfactory.

The magnitude of the various angles described above (the dynamic contact angles (advancing angle, receding angle, and sliding angle) and the static contact angle) can be adjusted by adjusting the formulation for the resist composition for immersion exposure, for example by varying the type or amount of the component (C) and varying the type of the component (A). For example, the larger the amount of the component (C), the higher the hydrophobicity of the obtained resist composition, and hence, the larger the advancing angle, the receding angle and the static contact angle, and the smaller the sliding angle.

In this manner, the resist composition for immersion exposure according to the present invention satisfactorily exhibits all the properties required of a resist material for immersion exposure, and can therefore be used very favorably as an immersion exposure composition.

Moreover, because the component (C) also includes a naphthalene ring, the resist composition for immersion exposure according to the present invention exhibits superior transparency to light having a wavelength in the vicinity of 193 nm than compositions that include a fluorine-containing compound having a benzene ring. Accordingly, the resist composition for immersion exposure according to the present invention is particularly suitable for immersion exposure that uses an ArF excimer laser as the exposure source.

<<Method of Forming a Resist Pattern>>

The method of forming a resist pattern according to the present invention includes: forming a resist film on a substrate using the resist composition for immersion exposure according to the present invention, subjecting the resist film to immersion exposure, and subjecting the resist film to alkali developing to form a resist pattern.

A preferred example of the method of forming a resist pattern according to the present invention is described below.

Firstly, a resist composition for immersion exposure according to the present invention is applied onto a substrate using a spinner or the like, and a prebake (post applied bake (FAB)) is conducted to form a resist film.

The substrate is not specifically limited and a conventionally known substrate can be used. For example, substrates for electronic components, and such substrates having wiring patterns formed thereon can be exemplified. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-exemplified substrates provided with an inorganic and/or organic film on the surface thereof may also be used. As the inorganic film, an inorganic antireflection film (inorganic BARC) can be exemplified. As the organic film, an organic antireflection film (organic BARC) and an organic film such as a lower-layer organic film used in a multilayer resist method can be exemplified.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed.

After formation of a resist film, an organic antireflection film may be provided on the resist film, thereby forming a triple layer laminate consisting of the substrate, the resist film and the antireflection film. The antireflection film provided on top of the resist film is preferably soluble in an alkali developing solution.

The steps up until this point can be conducted by using conventional techniques. The operating conditions and the like are preferably selected appropriately in accordance with the formulation and the characteristics of the resist composition for immersion exposure being used.

Subsequently, the obtained resist film is subjected to selective immersion exposure (Liquid Immersion Lithography) through a desired mask pattern. At this time, the region between the resist film and the lens at the lowermost point of the exposure apparatus is pre-filled with a solvent (immersion medium) that has a larger refractive index than the refractive index of air, and the exposure (immersion exposure) is conducted in this state.

There are no particular limitations on the wavelength used for the exposure, and an ArF excimer laser, KrF excimer laser or $F_2$ laser or the like can be used. The resist composition according to the present invention is effective for KrF and ArF excimer lasers, and is particularly effective for an ArF excimer laser.

The immersion medium preferably exhibits a refractive index larger than the refractive index of air but smaller than the refractive index of the resist film formed from the resist composition for immersion exposure according to the present invention. The refractive index of the immersion medium is not particularly limited as long at it satisfies the above-mentioned requirements.

Examples of this immersion medium that exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and an example of a suitable perfluoroalkylamine compound is perfluorotributylamine (boiling point: 174° C.).

A resist composition for immersion exposure according to the present invention is particularly resistant to any adverse effects caused by water, and because the resulting lithography properties such as the sensitivity and shape of the resist pattern profile are excellent, water is preferably used as the immersion medium. Furthermore, water is also preferred in terms of cost, safety, environmental friendliness, and versatility.

Subsequently, following completion of the immersion exposure step, post exposure baking (FEB) is conducted, and a developing treatment is then performed using an alkali developing solution composed of an aqueous alkali solution. Thereafter, a water rinse is preferably conducted with pure water. This water rinse can be conducted by dripping or spraying water onto the surface of the substrate while rotating the substrate, and washes away the developing solution and those portions of the resist composition for immersion exposure that have been dissolved by the developing solution. By subsequently drying the resist, a resist pattern is obtained in which the resist film (the coating of the resist composition for immersion exposure) has been patterned into a shape faithful to the mask pattern.

EXAMPLES

As follows is a more detailed description of the present invention based on a series of examples, although the scope of the present invention is in no way limited by these examples.

Synthesis Example 1

Step 1

8.00 g (37.7 mmol) of a [compound 1] represented by a structural formula shown below was dissolved in 45.33 g of tetrahydrofuran (THF). To this solution was added and dissolved 1.88 mmol of V-601 (a trade name) (a radical polymerization initiator; dimethyl 2,2'-azobis(2-methylpropionate)) manufactured by Wako Pure Chemical Industries, Ltd. The resulting solution was then subjected to a polymerization reaction under a nitrogen atmosphere for 6 hours at 70° C. Following completion of the reaction, the reaction solution was cooled to room temperature. Subsequently, an operation in which the reaction solution was added dropwise to a large volume of methanol to precipitate the polymer was repeated three times. The thus obtained polymer was then dried under reduced pressure at room temperature, yielding 4.25 g of a white powder (yield: 53%). This product is termed "[polymeric compound 1]". This [polymeric compound 1] had a weight average molecular weight, determined by GPC and referenced against standard polystyrenes, of 13,500, and a dispersity of 1.37.

[Chemical Formula 49]

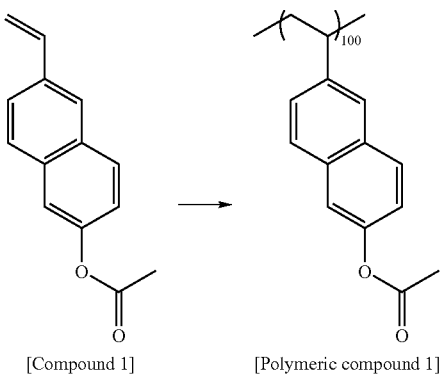

Step 2

Subsequently, under a nitrogen atmosphere at 0° C., 10 g of a THF solution containing 3.20 g (equivalent to 15 mmol) of the above [polymeric compound 1] and 0.406 g (3.32 mmol) of dimethylaminopyridine (DMAP) was prepared, and to this THF solution was added 3.20 g of methanol. The reaction solution was returned to room temperature, and then stirred for 15 hours under heating at 70° C. Subsequently, the reaction solution was cooled to room temperature and extracted 3 times into ethyl acetate, and the resulting organic layer was then washed twice with a 1N aqueous solution of hydrochloric acid and twice with water. The solvent was then removed from the organic layer by evaporation under reduced pressure, yielding 2.5 g of red crystals of a [polymeric compound 2].

Analysis of this [polymeric compound 2] using $^{13}$C-NMR to confirm the rate of deprotection of the acetyl groups revealed a deprotection rate of 100%. This result confirmed that all of the acetyl groups within the [polymeric compound 1] had dissociated.

[Chemical Formula 50]

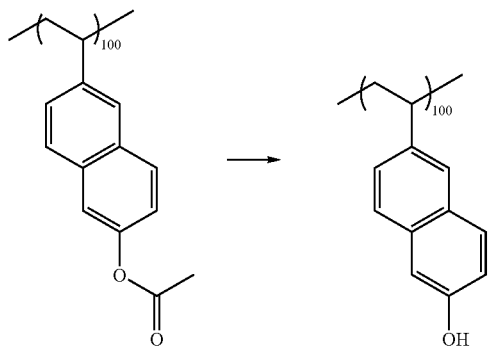

Step 3

Subsequently, under a nitrogen atmosphere at 0° C., 2.5 g (equivalent to 15 mmol) of the [polymeric compound 2] was added to 50 ml of a THF solution containing 4.3 g (34 mmol) of 3,3,3-trifluoropropionic acid, 8.0 g (41 mmol) of ethyldimethylaminopropylcarbodiimide (EDCI) hydrochloride and 0.2 g (2 mmol) of dimethylaminopyridine (DMAP), and the resulting solution was then returned to room temperature and stirred for 3 hours. The reaction solution was then cooled to 0° C., and water was added to halt the reaction. The resulting organic layer was washed with water three times, and the solvent was then removed by evaporation under reduced pressure. A re-precipitation operation was conducted by adding an ethyl acetate solution of the thus obtained crude product dropwise to heptane, thus yielding 2.9 g of the target [polymeric compound 3] as a colorless solid (yield: 71%).

Analysis of this [polymeric compound 3] using $^{13}$C-NMR to confirm the introduction of —CO—CH$_2$—CF$_3$ groups revealed an introduction rate of 100%. This result confirmed that all of the —OH groups within the [polymeric compound 2] had been converted to —O—CO—CH$_2$—CF$_3$ groups.

Furthermore, the weight average molecular weight of the [polymeric compound 3] measured by GPC was 17,500, and the dispersity was 1.37.

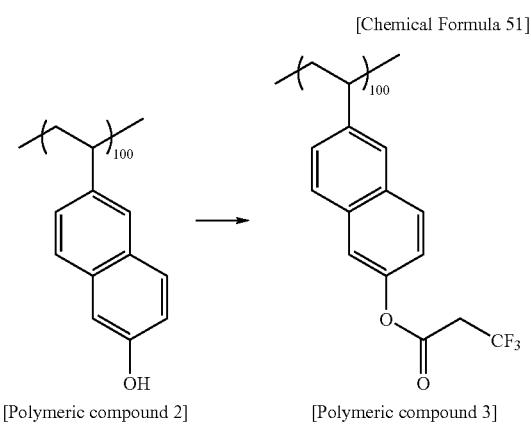

[Chemical Formula 51]

[Polymeric compound 2] → [Polymeric compound 3]

Synthesis Example 2

Under a nitrogen atmosphere at 0° C., 2.5 g (15 mmol) of 4-vinyl-2-naphthol was added to 40 ml of a THF solution containing 4.3 g (34 mmol) of 3,3,3-trifluoropropionic acid, 8.0 g (41 mmol) of ethyldimethylaminopropylcarbodiimide hydrochloride (EDCl) and 0.2 g (2 mmol) of dimethylaminopyridine (DMAP), and the resulting solution was then returned to room temperature and stirred for 3 hours. Following confirmation by thin layer chromatography (TLC) that the raw materials had been consumed, the reaction solution was cooled to 0° C., and water was added to halt the reaction. Subsequently, the reaction solution was extracted three times into ethyl acetate, and the resulting organic layer was washed twice with water. The solvent was then removed by evaporation under reduced pressure, and the resulting product was purified by silica gel chromatography (eluent: heptane-ethyl acetate), yielding 2.5 g of the target [compound 2] as an oily substance (yield: 60%).

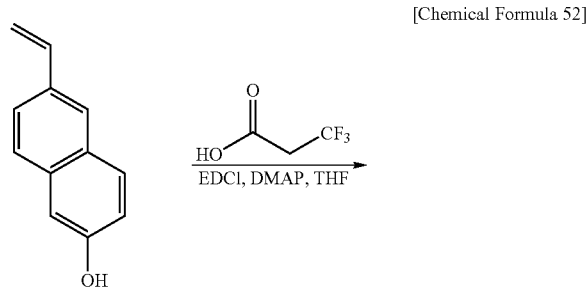

[Chemical Formula 52]

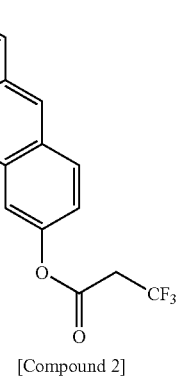

[Compound 2]

The thus obtained [compound 2] was measured by $^1$H-NMR. The results are shown below.

$^1$H-NMR (solvent: CDCl$_3$, 400 MHz): δ (ppm)=7.7 to 7.5 (m, 4H, H$^c$), 7.2 to 7.1 (m, 2H, H$^c$), 6.8 (dd, 1H, H$^b$), 5.8 (d, 1H, H$^a$), 5.2 (d, 1H, H$^a$), 3.5 (m, 2H, H$^d$).

The above results confirmed that the [compound 2] had the structure shown below.

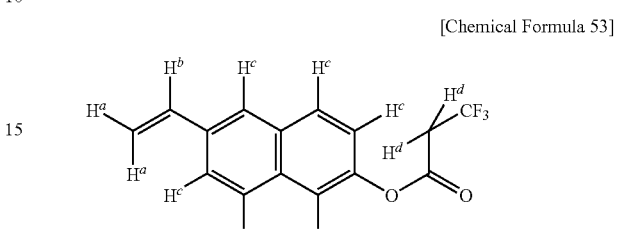

[Chemical Formula 53]

Examples 1 to 4, Comparative Examples 1 to 2

The components shown below in Table 1 were mixed together and dissolved to prepare a series of resist compositions.

TABLE 1

| | Component (A) | Component (B) | Component (C) | Component (D) | Component (S) |
|---|---|---|---|---|---|
| Example 1 | (A)-1 [100] | (B)-1 [8.0] | (C)-1 [1.0] | (D)-1 [1.2] | (S)-1 [1500] |
| Comparative Example 1 | (A)-1 [100] | (B)-1 [8.0] | — | (D)-1 [1.2] | (S)-1 [1500] |
| Example 2 | (A)-1 [100] | (B)-2 [8.0] | (C)-1 [1.0] | (D)-1 [1.2] | (S)-1 [1500] |
| Example 3 | (A)-1 [100] | (B)-2 [8.0] | (C)-1 [3.0] | (D)-1 [1.2] | (S)-1 [1500] |
| Example 4 | (A)-1 [100] | (B)-2 [8.0] | (C)-1 [5.0] | (D)-1 [1.2] | (S)-1 [1500] |
| Comparative Example 2 | (A)-1 [100] | (B)-2 [8.0] | — | (D)-1 [1.2] | (S)-1 [1500] |

The meanings of the abbreviations used in Table 1 are as shown below.

(A)-1: a copolymer represented by chemical formula (A)-1 shown below. In the formula, the subscript numerals shown to the bottom right of the parentheses ( ) indicate the percentage (mol %) of the respective structural units within the copolymer.

(B)-1: (4-methylphenyl)diphenylsulfonium nonafluoro-n-butane sulfonate.

(B)-2: an acid generator represented by a chemical formula (B)-2 shown below.

(C)-1: the [polymeric compound 3] synthesized in Synthesis Example 1.

(D)-1: tri-n-pentylamine (S)-1: a mixed solvent of PGMEA/PGME=6/4 (weight ratio).

[Chemical Formula 54]

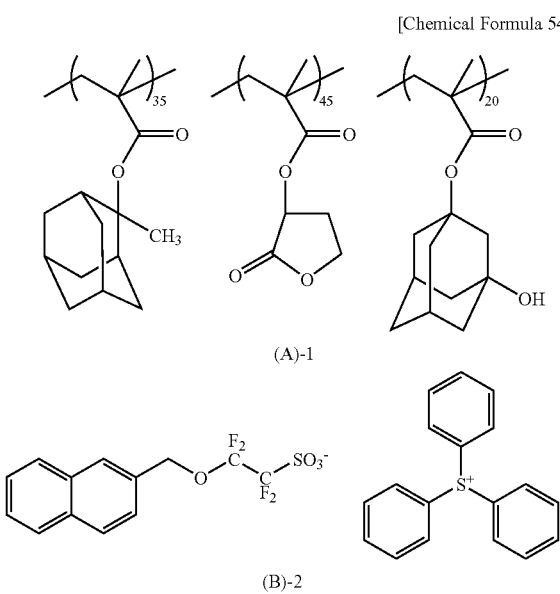

(A)-1

(B)-2

(Mw: 7,000, Mw/Mn: 1.8)

Subsequently, the resist compositions of Example 1 and Comparative Example 1 were each coated onto an 8-inch silicon wafer using a spinner, subsequently subjected to a prebake treatment on a hotplate for 60 seconds at 100° C., and then dried, yielding a resist film with a film thickness of 120 nm in each case.

A water droplet was dripped onto the surface of each resist film (the resist film prior to exposure), and a DROP MASTER-700 apparatus (a product name, manufactured by Kyowa Interface Science Co. Ltd.) was used to measure the contact angle (the static contact angle) (contact angle measurement: water 2 μl). The result of this measurement was recorded as the "post-coating contact angle (°)".

Following measurement of the contact angle, the wafer was subjected to a developing treatment for either 30 seconds or 60 seconds at 23° C. in a 2.38% by weight aqueous solution of tetramethylammonium hydroxide (TMAH). The wafer was then rinsed with pure water for 15 seconds. Subsequently, the contact angle was measured in the same manner as that described above. The measured values were recorded as "contact angle (°) after 30 s developing" and "contact angle (°) after 60 s developing" respectively.

Further, the resist compositions of Examples 2 to 4 and Comparative Example 2 were also evaluated in the same manner, although only the "contact angle (°) after 60 s developing" was measured.

Furthermore, for Examples 1 to 4 and Comparative Examples 1 and 2, the difference between the post-coating contact angle (°) and the contact angle (°) after 60 s developing was determined, and this difference was recorded as "Δ contact angle".

These results are shown in Table 2.

TABLE 2

| | Post-coating contact angle (°) | contact angle (°) after 30 s developing | contact angle (°) after 60 s developing | Δ contact angle (°) |
|---|---|---|---|---|
| Example 1 | 79.4 | 53.5 | 51.3 | 28.1 |
| Comparative Example 1 | 68.2 | 58.8 | 59.4 | 8.8 |
| Example 2 | 79.4 | — | 59.3 | 20.1 |
| Example 3 | 81.6 | — | 55.7 | 25.9 |
| Example 4 | 83.1 | — | 54.3 | 28.8 |
| Comparative Example 2 | 70.8 | — | 67.7 | 3.1 |

As is evident from the above results, the resist films formed using the resist compositions of Examples 1 to 4 which included the [polymeric compound 3] exhibited a higher contact angle prior to developing and a lower contact angle following developing than the resist films formed using the resist compositions of Comparative Examples 1 and 2 which did not include a fluorine-containing compound.

These results show that the resist compositions of Examples 1 to 4 exhibited hydrophobic properties during immersion exposure, but then developed hydrophilic properties during developing. These results confirmed that the action of the alkali developing solution caused the —CO—CH$_2$—CF$_3$ groups within the [polymeric compound 3] to dissociate, thereby generating —OH groups and increasing the solubility of the compound in the alkali developing solution.

An organic antireflection film composition (product name: ARC-29, manufactured by Brewer Science Ltd.) was coated onto the surface of an 8-inch silicon wafer using a spinner, and the composition was then baked and dried on a hotplate at 205° C. for 60 seconds, thereby forming an organic antireflection film having a thickness of 77 nm. Each of the resist compositions obtained in Examples 1 to 4 and Comparative Examples 1 and 2 was coated onto the surface of a substrate bearing the antireflection film using a spinner, and was then prebaked (PAB) and dried on a hotplate at 110° C. for 60 seconds, thereby forming a resist film having a film thickness of 140 nm.

Subsequently, each of the resist films was selectively irradiated through a mask pattern with an ArF excimer laser (193 nm), using an ArF exposure apparatus NSR-S302A (a product name, manufactured by Nikon Corporation, NA (numerical aperture)=0.60, ⅔ annular illumination). A PEB treatment was then conducted at 110° C. for 60 seconds, and the resist film was then subjected to a developing treatment for 30 seconds at 23° C. in a 2.38% by weight aqueous solution of tetramethylammonium hydroxide (TMAH). Subsequently, the substrate was rinsed with pure water for 30 seconds, and then spun dry, thereby completing the formation of a 140 nm line and space (1:1) resist pattern (hereafter referred to as a L/S pattern).

The above results confirmed that the present invention is useful as a resist composition.

The present invention is able to provide a novel fluorine-containing compound that is useful as an additive for a resist composition for immersion exposure, a resist composition for immersion composure that includes the fluorine-containing compound, and a method of forming a resist pattern that uses the resist composition for immersion composure, and the invention is therefore extremely useful industrially.

What is claimed is:

1. A fluorine-containing compound represented by a general formula (c-1-1) shown below:

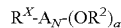

(c-1-1)

wherein, $R^X$ represents a group represented by a general formula: $CH_2=C(R^{03})-(CH_2)_b$; $R^{03}$ represents a hydrogen atom, a lower alkyl group, or a halogenated lower alkyl group; b represents an integer of 0 to 2; $A_N$ represents a naphthalene ring that may have a substituent; $R^2$ represents a base dissociable group that dissociates under the action of an alkali developing solution, thereby generating a hydrophilic phenolic hydroxyl group; and a represents 1 or 2; provided that at least one among $A_N$ and said $R^2$ groups contains a fluorine atom.

2. A fluorine-containing compound according to claim 1, wherein said $R^2$ represents one or more groups selected from among groups represented by general formulas (II-1) and (II-3) shown below:

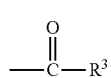

(II-1)

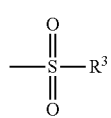

(II-3)

wherein, each $R^3$ independently represents a hydrocarbon group that may contain a fluorine atom.

3. A fluorine-containing compound according to claim 1, represented by a general formula (c0-1) shown below:

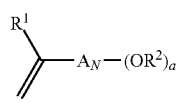

(c0-1)

wherein, $R^1$ represents a hydrogen atom, a lower alkyl group or a halogenated lower alkyl group, and $A_N$ represents a naphthalene ring that may have a substituent; $R^2$ represents a base dissociable group that dissociates under the action of an alkali developing solution, a hydrophilic phenolic hydroxyl group; and a represents 1 or 2: provided that at least one among $A_N$ and said $R^2$ groups includes a fluorine atom.

4. A fluorine-containing compound according to claim 3, represented by a general formula (c0-11) shown below:

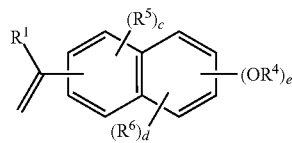

(c0-11)

wherein, $R^1$ represents a hydrogen atom, a lower alkyl group or a halogenated lower alkyl group; $R^4$ represents a base dissociable group containing a fluorine atom that dissociates under the action of an alkali developing solution, thereby generating a hydrophilic phenolic hydroxyl group, $R^5$ and $R^6$ each independently represents a substituent; c is an integer of 0 to 3, d is an integer of 0 to 3, and e is 1 or 2, provided that d+e is an integer of 1 to 4.

5. A fluorine-containing polymeric, having a structural unit represented by a general formula (c1-1) shown below:

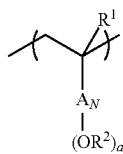

(c1-1)

wherein, $R^1$ represents a hydrogen atom, a lower alkyl group or a halogenated lower alkyl group; $A_N$ represents a naphthalene ring that may have a substituent; $R^2$ represents a base dissociable group that dissociates under the action of an alkali developing solution, thereby generating a hydrophilic phenolic hydroxyl group; and a represents 1 or 2; provided that at least one among $A_N$ and said $R^2$ groups contain a fluorine atom.

6. A fluorine-containing compound according to claim 5, which is a polymeric compound having a structural unit represented by a general formula (c1-11) shown below:

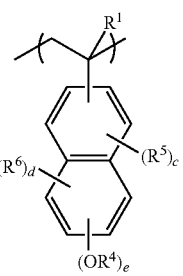

(c1-11)

wherein, $R^1$ is as defined above, represents a hydrogen atom, a lower alkyl group or a halogenated lower alkyl group, $R^4$ represents a base dissociable group containing a fluorine atom that dissociates under the action of an alkali developing solution, thereby generating hydrophilic phenolic hydroxyl group, $R^5$ and $R^6$ each independently represents a substituent; c is an integer of 0 to 3, d is an integer of 0 to 3, and e is 1 or 2, provided that d+e is an integer of 1 to 4.

7. A resist composition for immersion exposure, comprising a base component (A) that exhibits changed solubility in an alkali developing solution under action of acid, an acid generator component that generates acid upon exposure, and a fluorine-containing compound (C) represented by a general formula (c-1) shown below:

[Chemical Formula 7]

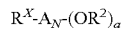

(c-1)

wherein, $R^X$ represents an organic group, $A_N$ represents a naphthalene ring that may have a substituent; $R^2$ represents a base dissociable group that dissociates under the action of an alkali developing solution, thereby generating a hydrophilic phenolic hydroxyl group, and a represents 1 or 2, provided that at least one among $A_N$ and said a $R^2$ groups includes a fluorine atom, wherein
the amount of the fluorine-containing compound (C) is 0.1 to 20 parts by weight, relative to 100 parts by weight of the base component (A).

8. A resist composition for immersion exposure according to claim 7, wherein said $R^2$ represents one or more groups selected from among groups represented by general formulas (II-1) to (II-3) shown below:

[Chemical Formula 8]

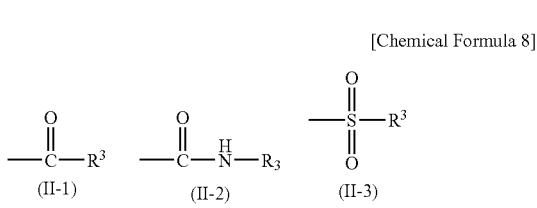

wherein, each $R^3$ independently represents a hydrocarbon group that may contain a fluorine atom.

9. A resist composition for immersion exposure according to claim 7 or 8, wherein said fluorine-containing compound (C) is a compound represented by a general formula (c0-1) shown below:

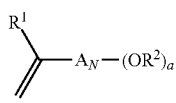

wherein, $R^1$ represents a hydrogen atom, a lower alkyl group or a halogenated lower alkyl group; $A_N$ represents a naphthalene ring that may have a substituent; $R^2$ represents a base dissociable group that dissociates under the action of an alkali developing solution, thereby generating a hydrophilic phenolic hydroxyl group; and a represents 1 or 2; provided that at least one among $A_N$ and said $R^2$ groups includes a fluorine atom.

10. A resist composition for immersion exposure according to claim 9, wherein said fluorine-containing compound (C) is a compound represented by a general formula (c0-11) shown below:

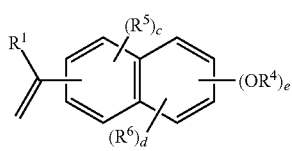

wherein, $R^1$ is as defined above, $R^{11}$ represents a hydrogen atom, a lower alkyl group or a halogenated lower alkyl group, $R^4$ represents a base dissociable group containing a fluorine atom that dissociates under the action of an alkali developing solution, thereby generating hydrophilic phenolic hydroxyl group, $R^5$ and $R^6$ each independently represents a substituent; c is an integer of 0 to 3; d is an integer of 0 to 3; and e is 1 or 2 provided that d+e is an integer of 1 to 4.

11. A resist composition for immersion exposure according to claim 7, wherein said fluorine-containing compound (C) is a polymeric compound having a structural unit represented by a general formula (c1-1) shown below:

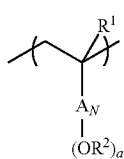

wherein, $R^1$ represents a hydrogen atom, a lower alkyl group or a halogenated lower alkyl group; $A_N$ represents a naphthalene ring that may have a substituent; $R^2$ represents a base dissociable group that dissociates under the action of an alkali developing solution, thereby generating a hydrophilic phenolic hydroxyl group; and a represents 1 or 2; provided that at least one among $A_N$ and said $R^2$ groups includes a fluorine atom.

12. A resist composition for immersion exposure according to claim 11, wherein said fluorine-containing compound (C) is a polymeric compound having a structural unit represented by a general formula (c1-11) shown below:

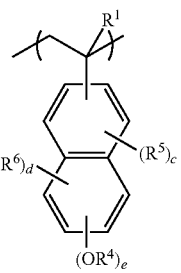

wherein, $R^1$ is as defined above, represents a hydrogen atom, a lower alkyl group or a halogenated lower alkyl group, $R^4$ represents a base dissociable group containing a fluorine atom that dissociates under the action of an alkali developing solution, thereby generating a hydrophilic phenolic hydroxyl group, $R^5$ and $R^6$ each independently represents a substituent; c is an integer of 0 to 3; d is an integer of 0 to 3; and e is 1 or 2 provided that d+e is an integer of 1 to 4.

13. A resist composition for immersion exposure according to claim 7, wherein said base component (A) is a base component that exhibits increased solubility in an alkali developing solution under action of acid.

14. A resist composition for immersion exposure according to claim 13, wherein said base component (A) comprises a resin component (A1) that exhibits increased solubility in an alkali developing solution under action of acid, and said resin component (A1) comprises a structural unit (a1) derived from an acrylate ester containing an acid dissociable, dissolution inhibiting group.

15. A resist composition for immersion exposure according to claim 14, wherein said resin component (A1) further comprises a structural unit (a2) derived from an acrylate ester containing a lactone-containing cyclic group.

16. A resist composition for immersion exposure according to claim 14, wherein said resin component (A1) further comprises a structural unit (a3) derived from an acrylate ester containing a polar group-containing aliphatic hydrocarbon group.

17. The resist composition for immersion exposure according to claim 7, further comprising a nitrogen-containing organic compound (D).

18. A method of forming a resist pattern, comprising: forming a resist film on a substrate using a resist composition for immersion exposure according to claim 7, subjecting said resist film to immersion exposure, and subjecting said resist film to alkali developing to form a resist pattern.

19. A fluorine-containing compound represented by a general formula (c-1-2) shown below:

$$R^X\text{-}A_N\text{-}(OR^2)_a \tag{c-1-2}$$

wherein, $R^X$ represents an organic group; $A_N$ represents a naphthalene ring that may have a substituent; $R^2$ represents a base dissociable group that dissociates under the action of an alkali developing solution, thereby generating a hydrophilic phenolic hydroxyl group; and a represents 1 or 2; provided that at least one of $A_N$ and $R^2$ contains a fluorine atom, wherein said $R^2$ represents a group represented by general formulas (II-2) shown below:

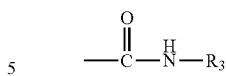
(II-2)

wherein, $R^3$ represents a hydrocarbon group that may contain a fluorine atom.

* * * * *

UNITED STATES PATENT AND TRADEMARK OFFICE
CERTIFICATE OF CORRECTION

PATENT NO. : 7,989,138 B2
APPLICATION NO. : 12/323212
DATED : August 2, 2011
INVENTOR(S) : Sanae Furuya et al.

It is certified that error appears in the above-identified patent and that said Letters Patent is hereby corrected as shown below:

On the Title Page 1, (Item 56) Col. 2, Line 2, Under Other Publications, change "Lithograhy," to --Lithography,--.

At Column 3, Line 50, Change "the a" to --the--.

At Column 3, Line 66, Change "the a" to --the--.

At Column 4, Line 39, Change "angle" to --angle.--.

At Column 5, Line 4, Change "the a" to --the--.

At Column 6, Line 66, Change "the a" to --the--.

At Column 7, Line 50, Change "$CH_2=C(R_{03})-(CH_2)_b-$" to --$CH_2=C(R^{03})-(CH_2)_b-$--.

At Column 8, Line 50, Change "preferred," to --preferred.--.

At Column 11, Line 67, Change "preferred," to --preferred.--.

At Column 12, Line 26, Change "exposure," to --exposure.--.

At Column 13, Line 29, Change "acid," to --acid.--.

At Column 14, Line 37, Change "material," to --material.--.

At Column 15, Line 13 (Approx.), Change "ammo" to --amino--.

At Column 61, Line 47, Change "group," to --group.--.

Signed and Sealed this
Twenty-eighth Day of February, 2012

David J. Kappos
*Director of the United States Patent and Trademark Office*

CERTIFICATE OF CORRECTION (continued)

U.S. Pat. No. 7,989,138 B2

At Column 62, Line 3, Change "ring," to --ring.--.

At Column 72, Line 41, Change "group" to --group.--.

At Column 74, Line 27, Change "hands" to --hand,--.

At Column 79, Lines 29-30, Change "meflianesulfonate," to --methanesulfonate,--.

At Column 83, Lines 3-4, Delete "preferably has 1 to 10 carbon atoms, more preferably 1 to 8 carbon atoms, and most preferably 1 to 6 carbon atoms." and insert the same on col. 83, Line 2, after "$R^{35}$", as a continuation of the same paragraph.

At Column 83, Line 10, Change "mores" to -- more, --.

At Column 83, Line 47, Change "(trifluoromemylsulfonyloxyimino)" to --(trifluoromethylsulfonyloxyimino)--.

At Column 83, Line 48, Change "(trifluoromemylsulfonyloxyiniino)" to --(trifluoromemylsulfonyloxyimino)--.

At Column 83, Line 54, Change "(emylsulfonyloxyimino)" to --(ethylsulfonyloxyimino)--.

At Column 84, Line 8, Change "exemplified," to --exemplified.--.

At Column 88, Line 23, Change "exposure," to --exposure.--.

At Column 92, Line 17, Change "at" to --as--.

At Column 92, Line 54 (Approx.), Change "(FEB)" to --(PEB)--.

At Column 96, Line 65 (Approx.), Change "pentylamine" to --pentylamine.--.

At Column 97, Line 29 (Approx.), Change "100°C.," to --110°C.,--.

At Column 98, Line 44 (Approx.), Change "FEB" to --PEB--.

At Column 99, Line 43, In Claim 3, after "solution," insert --thereby generating--.

At Column 99, Line 62, In Claim 4, change "group," to --group;--.

At Column 100, Line 35 (Approx.), In Claim 6, after "$R^1$" delete "is as defined above,".

CERTIFICATE OF CORRECTION (continued)
U.S. Pat. No. 7,989,138 B2

At Column 100, Line 36, In Claim 6, change "group," to --group;--.

At Column 100, Line 39, In Claim 6, change "generating" to --generating a--.

At Column 100, Line 40 (Approx.), In Claim 6, change "group," to --group;--.

At Column 100, Line 58, In Claim 7, change "group," to --group;--.

At Column 101, Line 45 (Approx.), In Claim 10, after "$R^1$" delete "is as defined above,".

At Column 101, Line 45 (Approx.), In Claim 10, before "represents" delete "$R^{11}$".

At Column 101, Line 46 (Approx.), In Claim 10, change "group," to --group;--.

At Column 101, Line 49 (Approx.), In Claim 10, change "generating" to --generating a--.

At Column 101, Line 50 (Approx.), In Claim 10, change "group," to --group;--.

At Column 102, Line 28 (Approx.), In Claim 12, after "$R^1$" delete "is as defined above,".

At Column 102, Line 29 (Approx.), In Claim 12, change "group," to --group;--.

At Column 102, Line 33 (Approx.), In Claim 12, change "group," to --group;--.